United States Patent
Chien et al.

(10) Patent No.: US 11,698,423 B2
(45) Date of Patent: Jul. 11, 2023

(54) MAGNETIC TUNNEL JUNCTION DEVICE AND METHOD

(71) Applicant: Taiwan Semiconductor Manufacturing Co., Ltd., Hsinchu (TW)

(72) Inventors: Jui-Fen Chien, Taichung (TW); Wei-Gang Chiu, Hsinchu (TW); Tsann Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 305 days.

(21) Appl. No.: 16/991,424

(22) Filed: Aug. 12, 2020

(65) Prior Publication Data
US 2022/0050150 A1    Feb. 17, 2022

(51) Int. Cl.
| | | |
|---|---|---|
| *G11C 11/16* | (2006.01) | |
| *G01R 33/09* | (2006.01) | |
| *H10B 61/00* | (2023.01) | |
| *H10N 50/01* | (2023.01) | |
| *H10N 50/10* | (2023.01) | |
| *H10N 50/80* | (2023.01) | |
| *H10N 50/85* | (2023.01) | |

(52) U.S. Cl.
CPC .......... *G01R 33/093* (2013.01); *G11C 11/161* (2013.01); *G11C 11/1655* (2013.01); *G11C 11/1657* (2013.01); *H10B 61/22* (2023.02); *H10N 50/01* (2023.02); *H10N 50/10* (2023.02); *H10N 50/80* (2023.02); *H10N 50/85* (2023.02)

(58) Field of Classification Search
CPC .............. G11C 11/161; G11C 11/1655; G11C 11/1657; H01L 27/228; H01L 43/02; H01L 43/08; H01L 43/10; H01L 43/12; G01R 33/093
USPC ........................................................ 257/421
See application file for complete search history.

(56) References Cited

U.S. PATENT DOCUMENTS

| | | | |
|---|---|---|---|
| 10,522,745 B2 | 12/2019 | Patel et al. | |
| 10,648,069 B2 | 5/2020 | Patel et al. | |
| 11,031,544 B2 | 6/2021 | Gupta et al. | |
| 11,043,251 B2 * | 6/2021 | Shen ...................... H01L 43/10 |
| 2007/0297222 A1 | 12/2007 | Leuschner | |

(Continued)

FOREIGN PATENT DOCUMENTS

| | | | | |
|---|---|---|---|---|
| CN | 102334207 A | * | 1/2012 | ............. B82Y 25/00 |
| DE | 112018004617 T5 | | 7/2020 | |

(Continued)

*Primary Examiner* — Jami Valentine Miller
(74) *Attorney, Agent, or Firm* — Slater Matsil, LLP

(57) ABSTRACT

In an embodiment, a device includes: a magnetoresistive random access memory cell including: a bottom electrode; a reference layer over the bottom electrode; a tunnel barrier layer over the reference layer, the tunnel barrier layer including a first composition of magnesium and oxygen; a free layer over the tunnel barrier layer, the free layer having a lesser coercivity than the reference layer; a cap layer over the free layer, the cap layer including a second composition of magnesium and oxygen, the second composition of magnesium and oxygen having a greater atomic concentration of oxygen and a lesser atomic concentration of magnesium than the first composition of magnesium and oxygen; and a top electrode over the cap layer.

20 Claims, 21 Drawing Sheets

(56) References Cited

U.S. PATENT DOCUMENTS

| | | | |
|---|---|---|---|
| 2010/0073827 A1* | 3/2010 | Zhao | G11B 5/3929 |
| 2010/0078310 A1* | 4/2010 | Tsunekawa | H01F 10/3295 |
| | | | 204/192.2 |
| 2011/0089507 A1 | 4/2011 | Mao | |
| 2013/0277207 A1* | 10/2013 | Tsunekawa | C23C 14/345 |
| | | | 204/298.25 |
| 2015/0145081 A1 | 5/2015 | Oh et al. | |
| 2016/0254444 A1 | 9/2016 | Tahmasebi et al. | |
| 2018/0006215 A1 | 1/2018 | Jeong et al. | |
| 2018/0331279 A1* | 11/2018 | Shen | B81C 1/00111 |
| 2019/0157344 A1 | 5/2019 | Wei et al. | |
| 2019/0165258 A1 | 5/2019 | Peng et al. | |
| 2020/0106008 A1 | 4/2020 | Peng et al. | |
| 2021/0175284 A1* | 6/2021 | Ouellette | H01F 10/3286 |

FOREIGN PATENT DOCUMENTS

| | | |
|---|---|---|
| KR | 20180002940 A | 1/2018 |
| KR | 20190059214 A | 5/2019 |
| KR | 20200037058 A | 4/2020 |
| TW | 202013367 A | 4/2020 |

\* cited by examiner

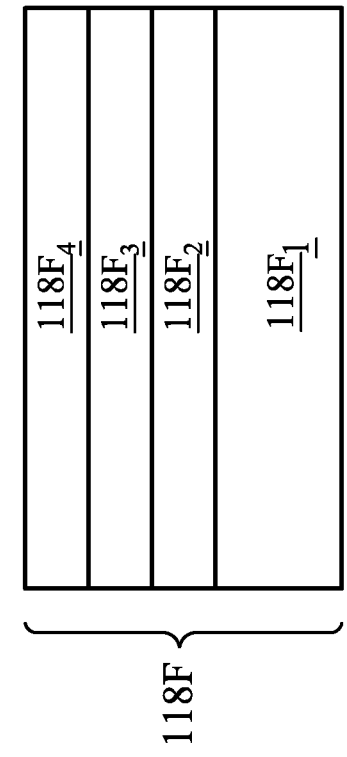
Figure 9A
Figure 9B
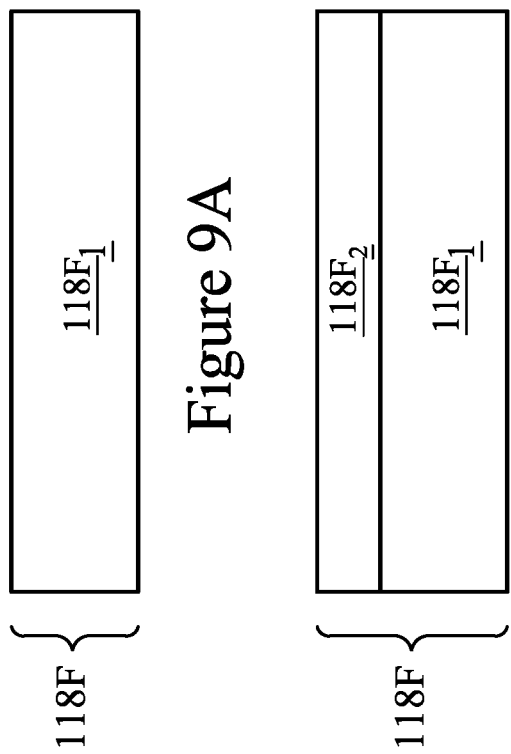
Figure 9C
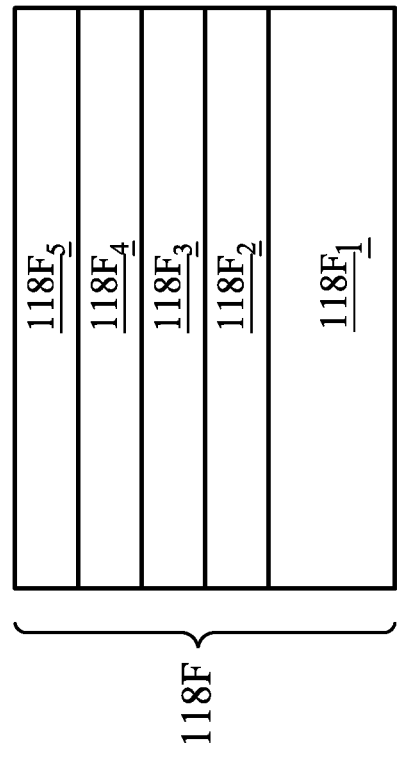
Figure 9D
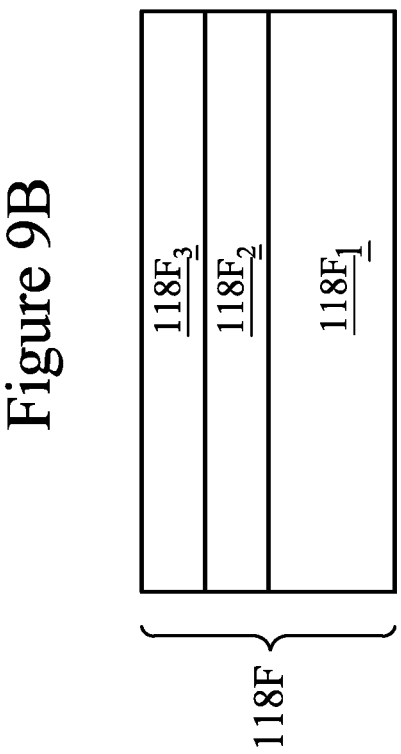
Figure 9E

MAGNETIC TUNNEL JUNCTION DEVICE AND METHOD

BACKGROUND

Semiconductor memories are used in integrated circuits for electronic applications, including radios, televisions, cell phones, and personal computing devices, as examples. One type of semiconductor memory is magnetoresistive random access memory (MRAM), which involves spintronics that combines semiconductor technology and magnetic materials and devices. The spins of electrons, through their magnetizations, are used to indicate bit codes. A MRAM cell typically includes a magnetic tunnel junction (MTJ) element, which includes two ferromagnets separated by a thin insulator.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4, 5, 6, 7, 8, 9A, 9B, 9C, 9D, 9E, 10, 11, 12, 13, 14, 15, 16, 17, and 18 are cross-sectional views of intermediate stages in the manufacturing of a semiconductor device, in accordance with some embodiments.

DETAILED DESCRIPTION

Figure 1:
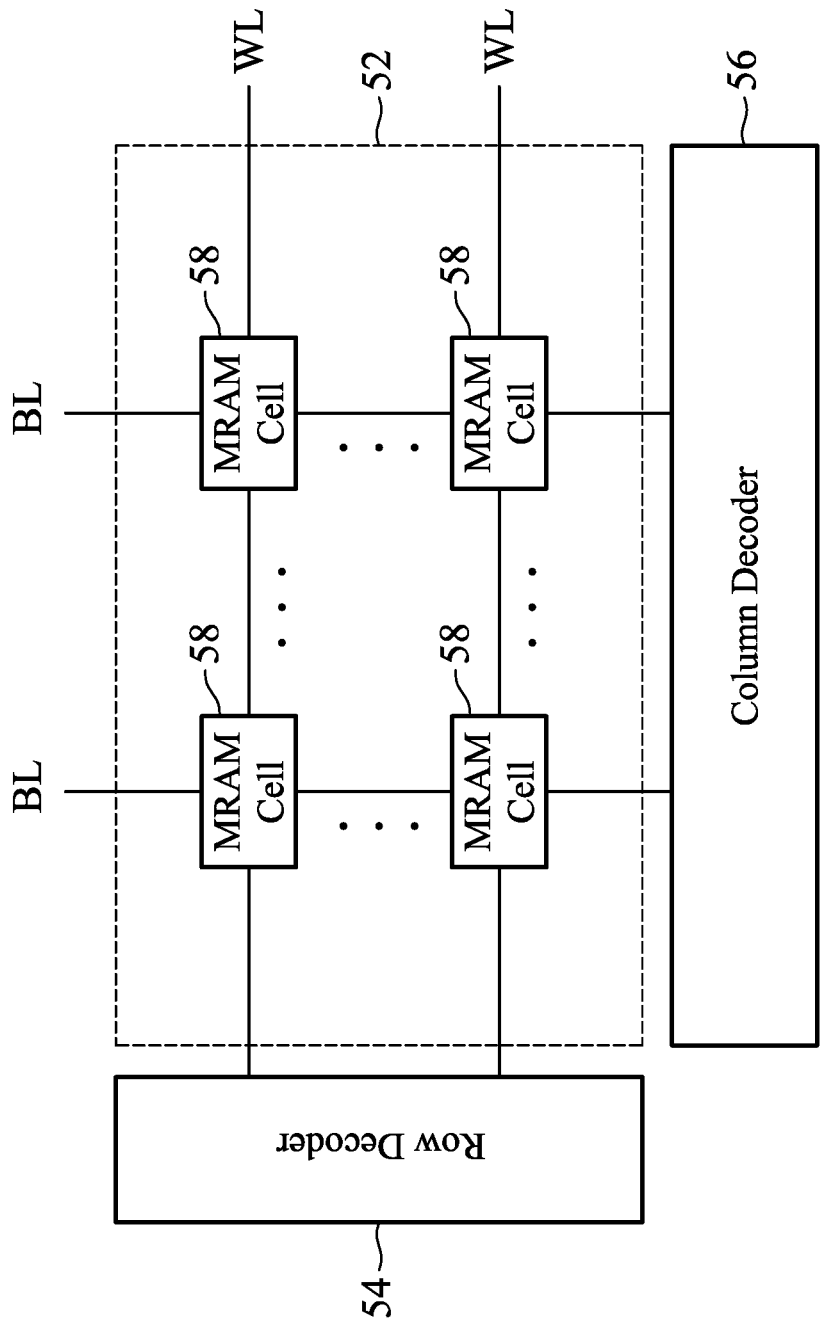
FIG. 1 is a block diagram of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a perpendicular magnetic tunnel junction (MTJ) element is formed with a cap layer that is fully oxidized magnesium. Full oxidation of the cap lay can be accomplished by forming the cap layer through repeated deposition and oxidation of multiple conductive sublayers. The deposition can be by direct current (DC) sputtering or atomic layer deposition (ALD), which allows the cap layer to have a greater concentration of oxidation than radio frequency (RF) sputtering. Forming an MTJ element with a cap layer of fully oxidized magnesium allows the perpendicular magnetic anisotropy (PMA) of the MTJ element to be increased, thus allowing the write error rate (WER) and read error rate (RER) of the resulting magnetoresistive random access memory (MRAM) cells to be improved.

FIG. 1 is a block diagram of a semiconductor device 50, in accordance with some embodiments. The semiconductor device 50 includes a MRAM array 52, a row decoder 54, and a column decoder 56. The MRAM array 52 includes MRAM cells 58 arranged in rows and columns. The row decoder 54 may be, e.g., a static CMOS decoder, a pseudo-NMOS decoder, or the like. During operation, the row decoder 54 selects desired MRAM cells 58 in a row of the MRAM array 52 by activating the respective word line WL for the row. The column decoder 56 may be, e.g., a static CMOS decoder, a pseudo-NMOS decoder, or the like, and may include writer drivers, sense amplifiers, combinations thereof, or the like. During operation, the column decoder 56 selects bit lines BL for the desired MRAM cells 58 from columns of the MRAM array 52 in the selected row, and reads data from or writes data to the selected MRAM cells 58 with the bit lines BL.

Figure 2:
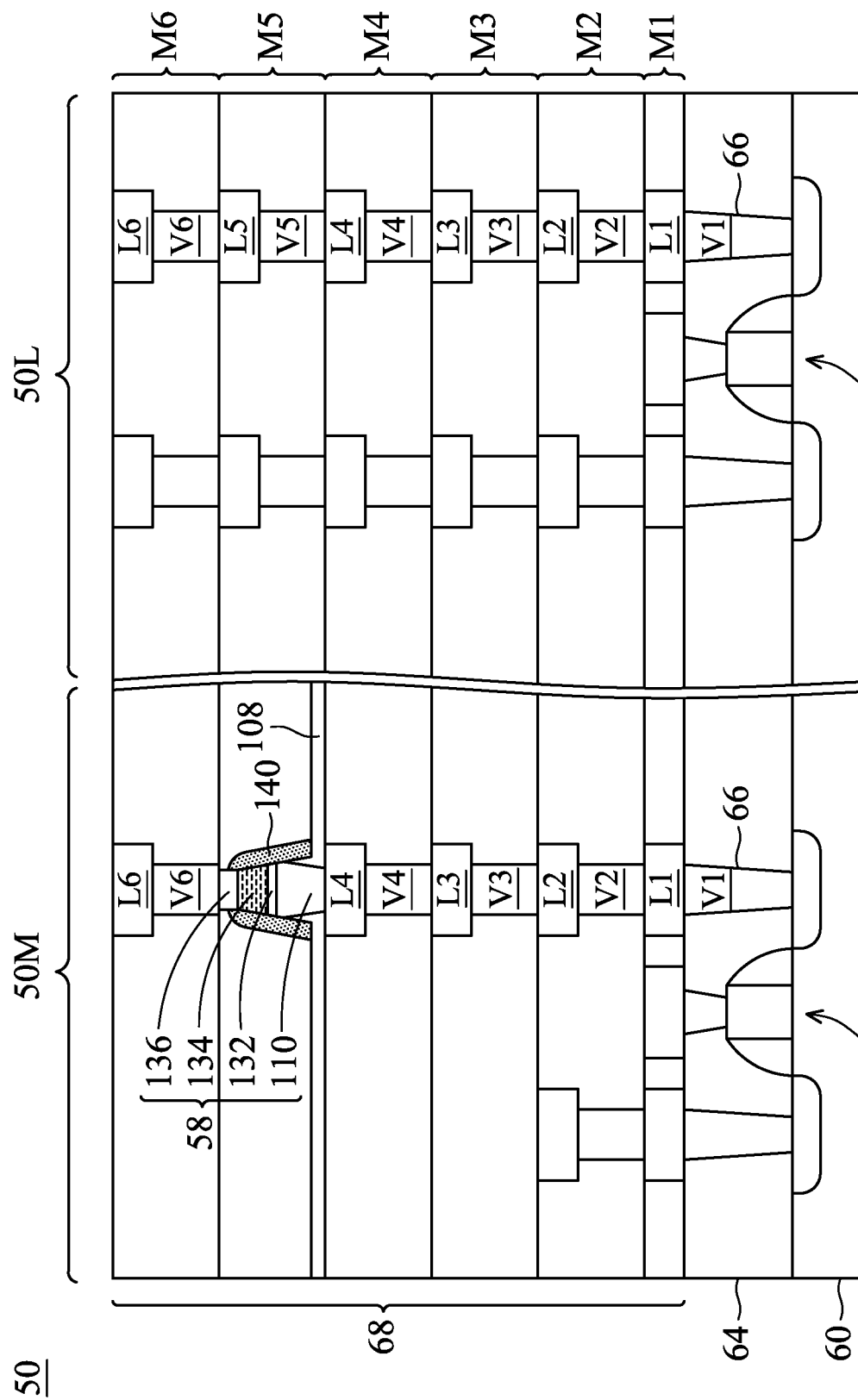
FIG. 2 is a cross-sectional view of a semiconductor device, in accordance with some embodiments.

FIG. 2 is a cross-sectional view of the semiconductor device 50, in accordance with some embodiments. FIG. 2 is a simplified view, and some features of the semiconductor device 50 (discussed below) are omitted for clarity of illustration. The semiconductor device 50 includes a logic region 50L and a memory region 50M. Memory devices (e.g., MRAMs) are formed in the memory region 50M and logic devices (e.g., logic circuits) are formed in the logic region 50L. For example, the MRAM array 52 (see FIG. 1) can be formed in the memory region 50M, and the row decoder 54 and the column decoder 56 (see FIG. 1) can be formed in the logic region 50L. The logic region 50L may occupy most of the area of the semiconductor device 50. For example, the logic region 50L may occupy from 95% to 99% of the area of the semiconductor device 50, with the memory region 50M occupying the remaining area of the semiconductor device 50. The memory region 50M can be disposed at an edge of the logic region 50L, or the logic region 50L can surround the memory region 50M.

The logic region 50L and memory region 50M are formed over a same substrate, e.g., a semiconductor substrate 60. The semiconductor substrate 60 may be silicon, doped or undoped, or an active layer of a semiconductor-on-insulator (SOI) substrate. The semiconductor substrate 60 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multilayered or gradient substrates, may also be used.

Devices 62 are formed at the active surface of the semiconductor substrate 60. The devices 62 may be active devices or passive devices. For example, the electrical components may be transistors, diodes, capacitors, resistors, or the like, formed by any suitable formation method. The devices 62 are interconnected to form the memory devices and logic devices of the semiconductor device 50. For example, some of the devices 62 may be access transistors for the MRAM cells 58.

One or more inter-layer dielectric (ILD) layer(s) 64 are formed on the semiconductor substrate 60, and electrically conductive features, such as contact plugs 66, are formed physically and electrically coupled to the devices 62. The ILD layer(s) 64 may be formed of any suitable dielectric material, for example, an oxide such as silicon oxide, phosphosilicate glass (PSG), borosilicate glass (BSG), boron-doped phosphosilicate glass (BPSG), or the like; a nitride such as silicon nitride; or the like. The ILD layer(s) may be formed by any suitable deposition process, such as spin coating, physical vapor deposition (PVD), chemical vapor deposition (CVD), the like, or a combination thereof. The electrically conductive features in the ILD layer(s) may be formed through any suitable process, such as deposition, damascene (e.g., single damascene, dual damascene, etc.), the like, or combinations thereof.

An interconnect structure 68 is formed over the semiconductor substrate 60, e.g., over the ILD layer(s) 64. The interconnect structure 68 interconnects the devices 62 to form integrated circuits in each of the logic region 50L and memory region 50M. The interconnect structure 68 includes multiple metallization layers M1-M6. Although six metallization layers are illustrated, it should be appreciated that more or less metallization layers may be included. Each of the metallization layers M1-M6 includes metallization patterns in dielectric layers. The metallization patterns are electrically coupled to the devices 62 of the semiconductor substrate 60, and include, respectively, metal lines L1-L6 and vias V1-V6 formed in one or more inter-metal dielectric (IMD) layers. The interconnect structure 68 may formed by a damascene process, such as a single damascene process, a dual damascene process, or the like. In some embodiments, the contact plugs 66 are also part of the metallization patterns, such as part of the lowest layer of metal vias V1.

The MRAM cells 58 of the MRAM array 52 (see FIG. 1) are formed in the interconnect structure 68. The MRAM cells 58 can be formed in any of the metallization layers M1-M6, and are illustrated as being formed in an intermediate metallization layer M5. Each MRAM cell 58 includes a conductive via 110, a bottom electrode 132 on the conductive via 110, a MTJ element 134 on the bottom electrode 132, and a top electrode 136 on the MTJ element 134. Another IMD layer 108 can be formed around the MRAM cells 58, with the conductive via 110 extending through the IMD layer 108. Spacers 140 can also be formed around the MRAM cells 58. The IMD layer 108 and/or spacers 140 surround and protect the components of the MRAM cells 58. The resistance of an MTJ element 134 is programmable, and can be changed between a high resistance ($R_{AP}$), which can signify a code such as a "1," and a low resistance ($R_P$), which can signify a code such as a "0." As such, a code can be written to an MRAM cell 58 by programming the resistance of its MTJ element 134 with its corresponding access transistor, and a code can be read from an MRAM cell 58 by measuring the resistance of its MTJ element 134 with its corresponding access transistor.

The MRAM cells 58 are electrically coupled to the devices 62. The conductive via 110 is physically and electrically coupled to an underlying metallization pattern, such as to the metal lines L4 in the illustrated example. The top electrode 136 is physically and electrically coupled to an overlying metallization pattern, such as to the metal vias V6 in the illustrated example. The MRAM cells 58 are arranged in a MRAM array having rows and columns of memory. The metallization patterns include access lines (e.g., word lines and bit lines) for the MRAM array. For example, the underlying metallization patterns (e.g., M1-M4) can include word lines disposed along the rows of the MRAM array and the overlying metallization patterns (e.g., M6) can include bit lines disposed along the columns of the MRAM array. Some of the devices 62 (e.g., access transistors), such as devices of the row decoder 54, are electrically coupled to the word lines of the MRAM array. The top electrodes 136 are electrically coupled to other devices, such as devices of the column decoder 56, by the bit lines of the MRAM array.

FIGS. 3 through 18 are various views of intermediate stages in the manufacturing of the semiconductor device 50, in accordance with some embodiments. Specifically, the manufacturing of the interconnect structure 68 (see FIG. 2) for the semiconductor device 50 is shown. As noted above, the interconnect structure 68 includes the MRAM cells 58 of the MRAM array 52 (see FIG. 1).

Figure 3:
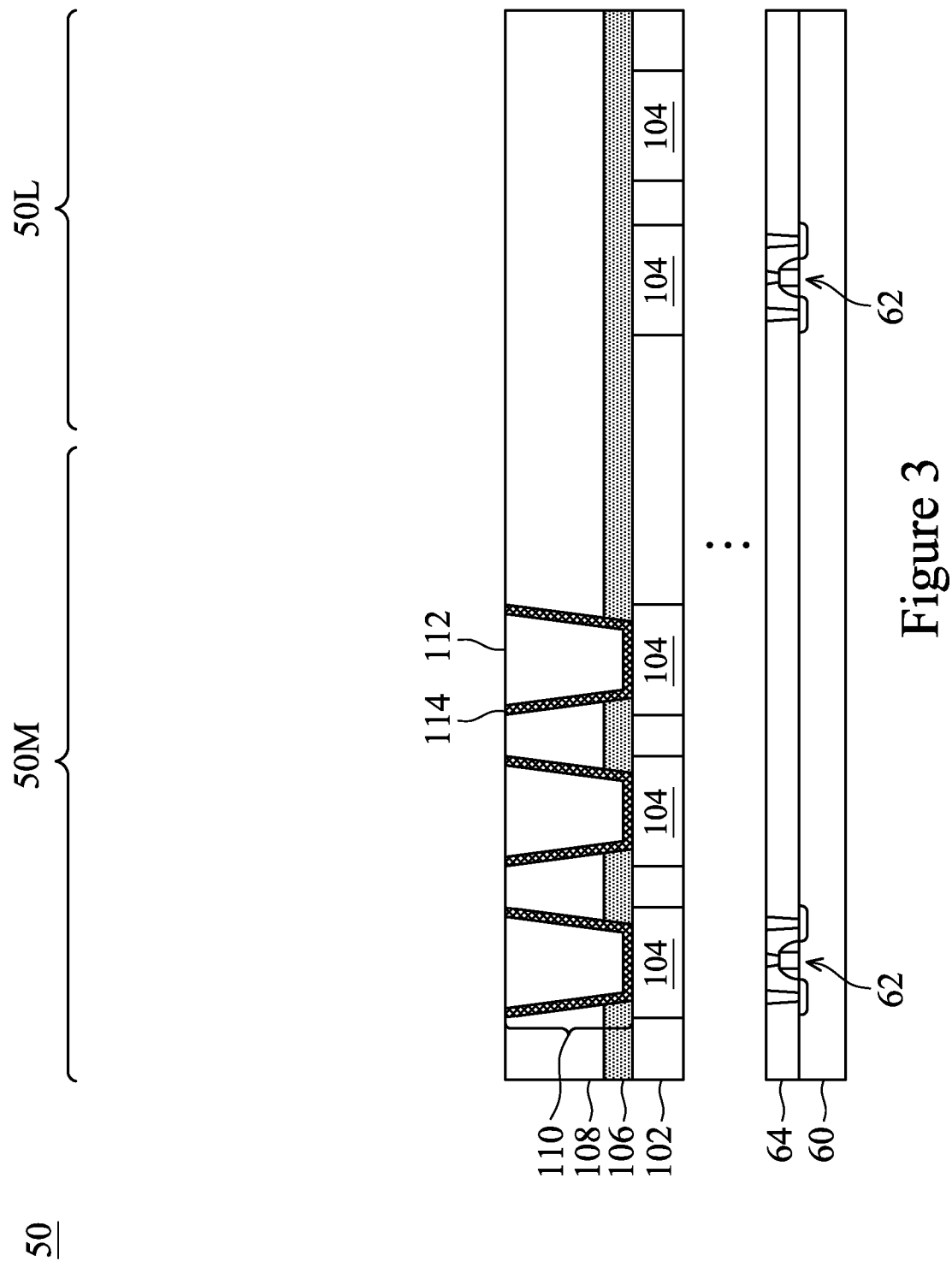

In FIG. 3, a metallization layer (e.g., M4, see FIG. 2) of the interconnect structure is formed. The metallization layer includes an IMD layer 102 and conductive features 104 (which can correspond to the metal lines L4, see FIG. 2). The IMD layer 102 is formed over the ILD layer(s) 64. The IMD layer 102 may be formed of any suitable dielectric material, for example, an oxide such as silicon oxide, phosphosilicate glass (PSG), borosilicate glass (BSG), boron-doped phosphosilicate glass (BPSG), or the like; a nitride such as silicon nitride; or the like. The IMD layer 102 may be formed by any suitable deposition process, such as spin coating, PVD, chemical vapor deposition (CVD), the like, or a combination thereof. The IMD layer 102 may be a layer formed of a low-k dielectric material having a k-value lower than about 3.0. The IMD layer 102 may be a layer formed of an extra-low-k (ELK) dielectric material having a k-value of less than 2.5.

Conductive features 104 are formed in the IMD layer 102, and are electrically coupled to the devices 62. In accordance with some embodiments, the conductive features 104 include diffusion barrier layers and conductive material over the diffusion barrier layers. Openings are formed in the IMD layer 102 using, e.g., an etching process. The openings expose underlying conductive features, such as underlying metal vias. The diffusion barrier layers may be formed of tantalum nitride, tantalum, titanium nitride, titanium, cobalt-tungsten, or the like, and may be formed in the openings by a deposition process such as atomic layer deposition (ALD) or the like. The conductive material may include copper, aluminum, tungsten, silver, and combinations thereof, or the like, and may be formed over the diffusion barrier layers in the openings by an electro-chemical plating process, CVD, ALD, PVD, the like, or a combination thereof. In an embodiment, the conductive material is copper, and the diffusion barrier layers are thin barrier layers that prevent the copper from diffusing into the IMD layer 102. After formation of the diffusion barrier layers and the conductive material, excess of the diffusion barrier layers and conductive material may be removed by, for example, a planarization process such as a chemical mechanical polish (CMP) process. In some embodiments, the conductive features 104 are metal lines (which can correspond to the metal lines L4, see FIG. 2).

An etch stop layer 106 is formed on the conductive features 104 and IMD layer 102. The etch stop layer 106 may be formed of a dielectric material such as aluminum nitride, aluminum oxide, silicon oxide, silicon nitride, silicon oxynitride, silicon carbide, a combination thereof, or the like. The etch stop layer 106 may be formed by chemical vapor deposition (CVD), PVD, ALD, a spin-on-dielectric process, the like, or a combination thereof. The etch stop layer 106 may also be a composite layer formed of a plurality of different dielectric sublayers. For example, the etch stop layer 106 may include a silicon carbide sublayer and an aluminum oxide sublayer formed on the silicon carbide sublayer. The silicon carbide sublayer can be used as a glue layer to improve adhesion between the aluminum oxide sublayer and the IMD layer 102.

An IMD layer 108 is formed on the etch stop layer 106. In some embodiments, the IMD layer 108 is formed of a tetraethyl orthosilicate (TEOS) oxide (e.g., silicon oxide deposited using, e.g., a chemical vapor deposition (CVD) process with TEOS as a precursor). In some embodiments, the IMD layer 108 may be formed using PSG, BSG, BPSG, undoped silicate glass (USG), fluorosilicate glass (FSG), SiOCH, flowable oxide, a porous oxide, or the like, or combinations thereof. The IMD layer 108 may also be formed of a low-k dielectric material with a k value lower than about 3.0, for example. The IMD layer 108 can be formed to a thickness in the range of about 50 nm to about 150 nm.

Conductive vias 110 are formed extending through the IMD layer 108 and etch stop layer 106. The conductive vias 110 can also be referred to as bottom vias. In some embodiments, the conductive vias 110 include conductive regions 112 and conductive barrier layers 114 lining sidewalls and bottom surfaces of the conductive regions 112. The conductive barrier layers 114 may be formed of titanium, titanium nitride, tantalum, tantalum nitride, cobalt, a combination thereof, or the like. The conductive regions 112 may be formed of metals such as copper, aluminum, tungsten, cobalt, alloys thereof, or the like. The formation of the conductive vias 110 may include etching the IMD layer 108 and the etch stop layer 106 to form via openings, conformally forming a conductive barrier layer extending into the via openings, depositing a metallic material over the conductive barrier layer, and performing a planarization process, such as a CMP process or a mechanical grinding process, to remove excess portions of the conductive barrier layer and the metallic material.

In FIGS. 4 through 10, a plurality of layers are deposited on the conductive vias 110 and the IMD layer 108. Specifically, a bottom electrode layer 116, an MTJ stack 118, and a top electrode layer 120 are deposited (see FIG. 10). The MTJ stack 118 is a multilayer that includes a ground layer 118A, a seed layer 118B, one or more reference layer(s) 118C, a tunnel barrier layer 118D, one or more free layer(s) 118E, a cap layer 118F, and one or more overcoat layer(s) 118G. The bottom electrode layer 116, the MTJ stack 118, and the top electrode layer 120 will be patterned in subsequent processing to form, respectively, the bottom electrodes 132, the MTJ elements 134, and the top electrodes 136 of respective MRAM cells 58 (see FIG. 2). FIGS. 4 through 10 are described in conjunction with FIG. 19.

Figure 19:
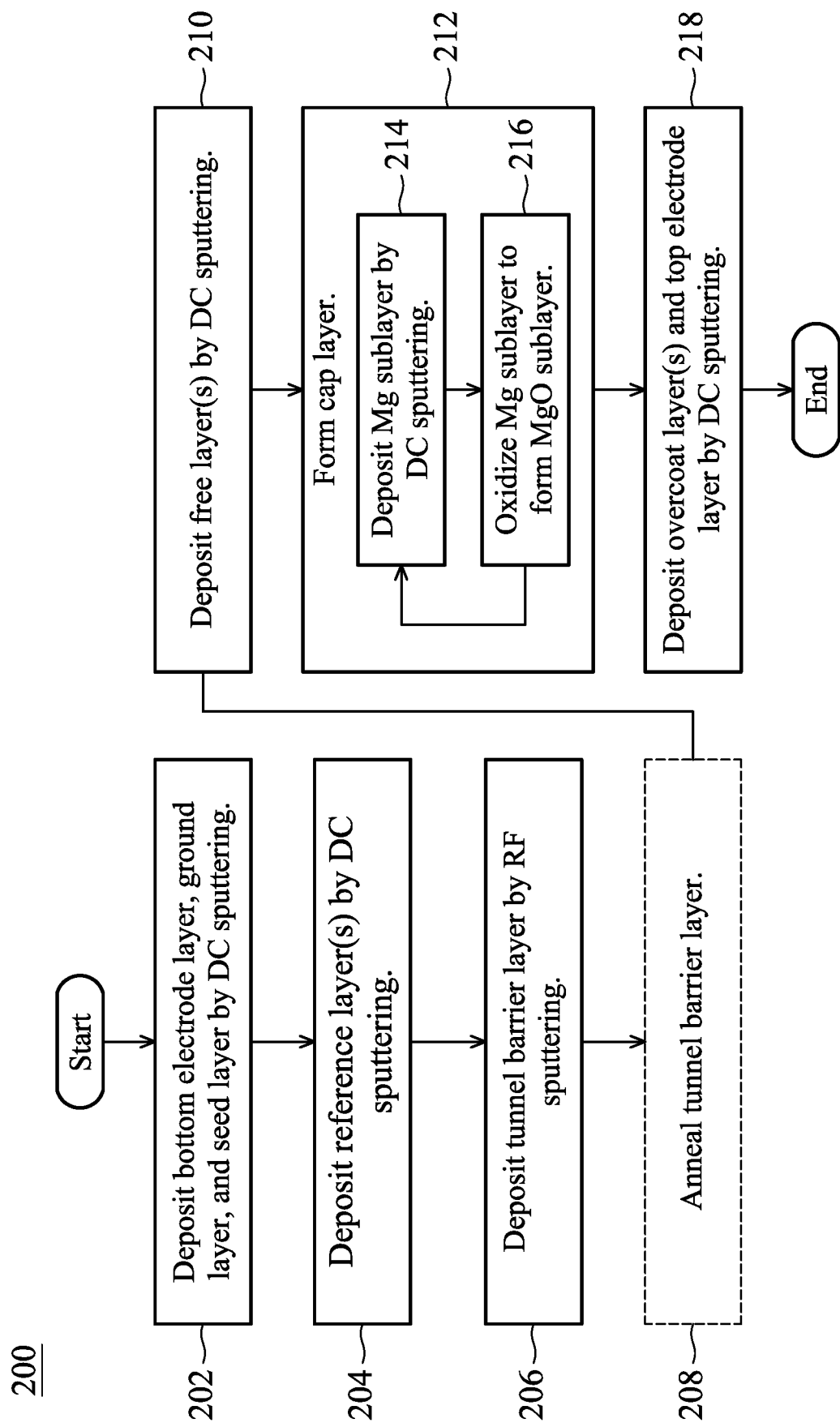
FIG. 19 is a flow chart of an example method for manufacturing a semiconductor device, in accordance with some embodiments.
Figure 20:
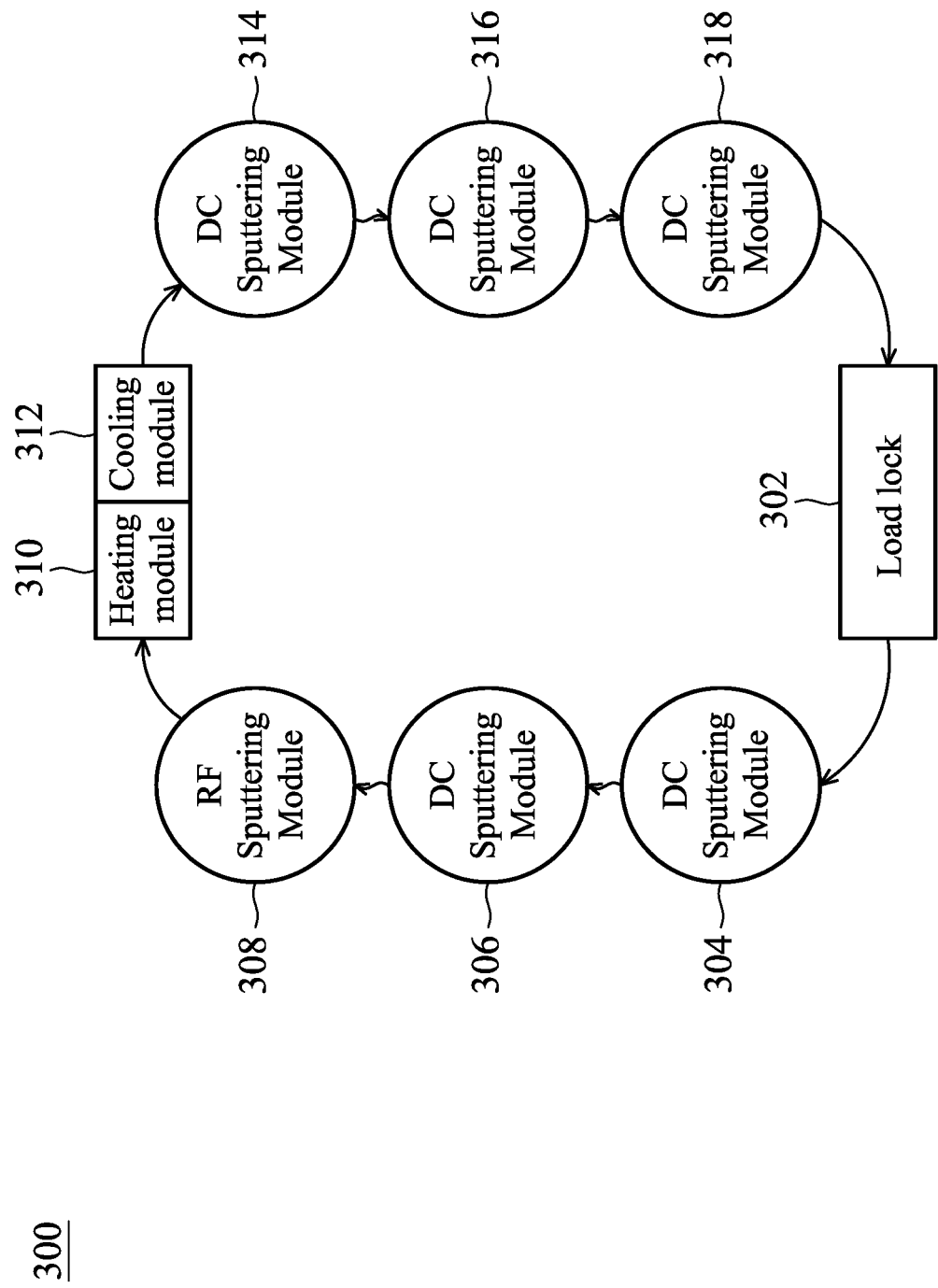
FIG. 20 is a block diagram of a processing tool.

FIG. 19 is a flow chart of an example method 200 for manufacturing the semiconductor device 50, in accordance with some embodiments. The method 200 can be performed by, e.g., a processing tool. FIG. 20 is a block diagram of a processing tool 300, which can perform the method 200. The processing tool 300 includes multiple modules 304, 306, 308, 310, 312, 314, 316, 318, and each of the steps 202, 204, 206, 208, 210, 212, 218 of the method 200 can be performed on a wafer by some or all of the modules of the processing tool 300. The modules may be, e.g., different areas or functions of the processing tool 300, and can be in the same chamber or in different chambers of the processing tool 300. The wafer processing can be in-situ, e.g., the wafers can be processed without breaking a vacuum in the processing tool 300 between each of the steps 202, 204, 206, 208, 210, 212, 218 of the method 200. Each of the steps 202, 204, 206, 208, 210, 212, 218 of the method 200 can also be performed in-situ, e.g., when a step includes depositing layers with a module, the layers can be deposited without breaking a vacuum in the module between each deposition. The vacuum can be set by a load lock 302 of the processing tool 300, which receives the wafers for processing. As discussed further below, the modules of the processing tool 300 include different types (e.g., direct current (DC) and radio frequency (RF)) of sputtering modules for performing PVD, which will be used to deposit the layers described with respect to FIGS. 4 through 10.

Figure 4:
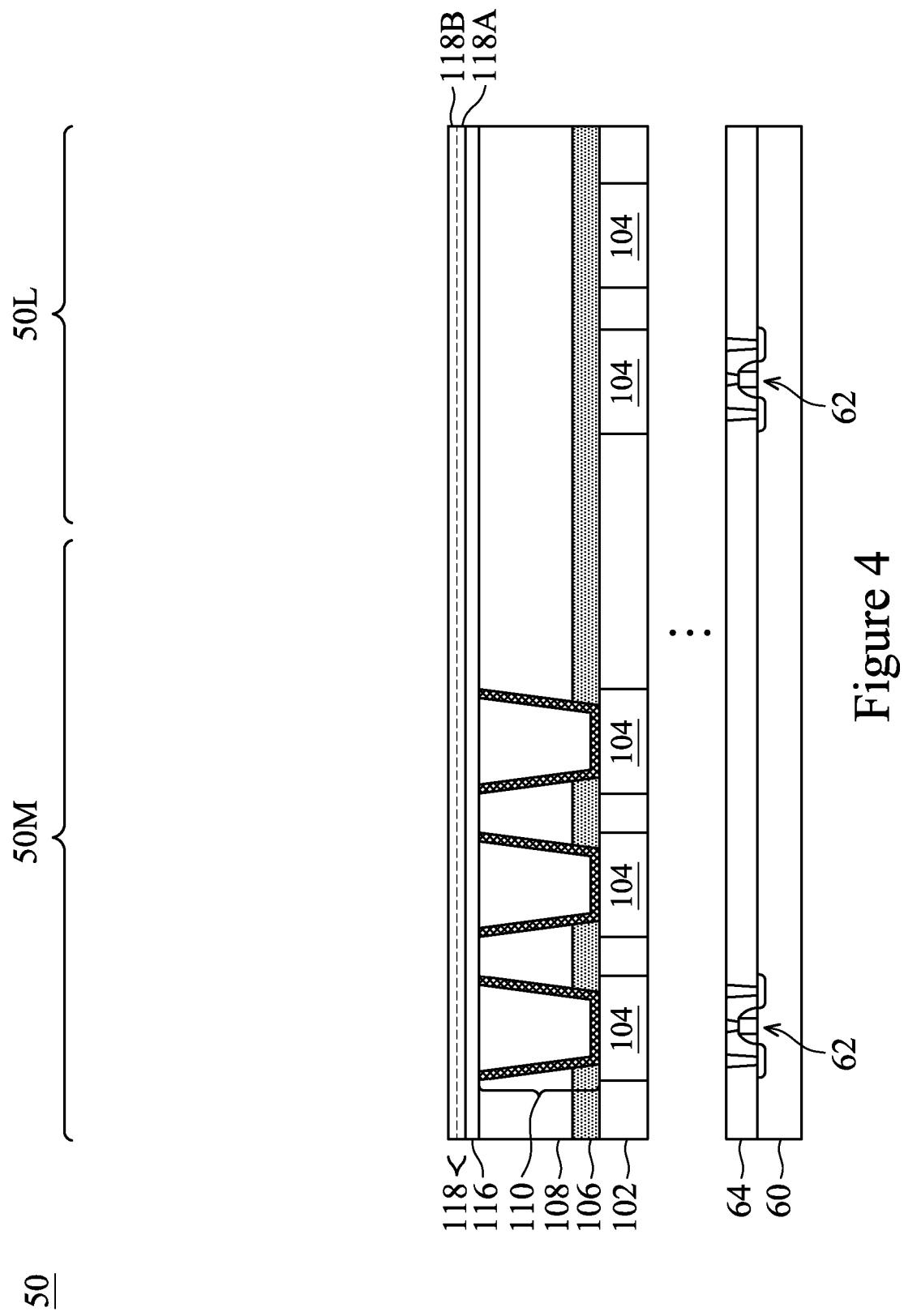

In FIG. 4, the bottom electrode layer 116 is formed on the conductive vias 110 and the IMD layer 108. The bottom electrode layer 116 is formed of a conductive material such as titanium (Ti), tantalum (Ta), aluminum (Al), tungsten (W), platinum (Pt), nickel (Ni), chromium (Cr), ruthenium (Ru), nitrides thereof, combinations thereof, multilayers thereof, or the like. The bottom electrode layer 116 is conformally formed, and may be formed using CVD, PVD, ALD, electro-chemical plating, electroless plating, or the like.

The ground layer 118A is formed on the bottom electrode layer 116. The ground layer 118A is formed of a conductive material such as tantalum (Ta), titanium (Ti), aluminum (Al), tungsten (W), platinum (Pt), nickel (Ni), chromium (Cr), ruthenium (Ru), nitrides thereof, combinations thereof, multilayers thereof, or the like. The ground layer 118A is conformally formed, and may be formed using CVD, PVD, ALD, electro-chemical plating, electroless plating, or the like.

The seed layer 118B is formed on the ground layer 118A. The seed layer 118B is formed of a conductive material such as ruthenium (Ru), titanium (Ti), tantalum (Ta), aluminum (Al), tungsten (W), platinum (Pt), nickel (Ni), chromium (Cr), nitrides thereof, combinations thereof, multilayers thereof, or the like. The seed layer 118B is conformally formed, and may be formed using CVD, PVD, ALD, electro-chemical plating, electroless plating, or the like.

As an example to form the bottom electrode layer 116, the ground layer 118A, and the seed layer 118B, in step 202 of the method 200, the layers can be deposited by DC sputtering. Specifically, a DC sputtering module is used to deposit a titanium nitride layer, thus forming the bottom electrode layer 116. The titanium nitride layer (e.g., the bottom electrode layer 116) can have a thickness in the range of about 8 nm to about 12 nm. A DC sputtering module is then used to deposit a tantalum nitride layer, thus forming the ground layer 118A. The tantalum nitride layer (e.g., the ground layer 118A) can have a thickness in the range of about 1 nm to about 5 nm. A DC sputtering module is then used to deposit a ruthenium layer, thus forming the seed layer 118B. The ruthenium layer (e.g., the seed layer 118B) can have a thickness in the range of about 2 nm to about 7 nm. In some embodiments, the same DC sputtering module is used to deposit each of the bottom electrode layer 116, the ground layer 118A, and the seed layer 118B. For example, a DC sputtering module 304 of the processing tool 300 can be used to deposit each of the layers. The DC sputtering module 304 may be a multiple-target module that is capable of sputtering the materials for each of the desired layers. During DC sputtering, a wafer is placed beneath a target and an inert gas is introduced to the DC sputtering module. DC power is applied to the target to activate the inert gas to a plasma state and bombard the target with ionized gas molecules, thus causing atoms from the target to be sputtered on the wafer being processed. DC sputtering of conductive materials can be performed at a lower cost and a higher deposition rate than other sputtering techniques, such as radio frequency (RF) sputtering.

Figure 5:
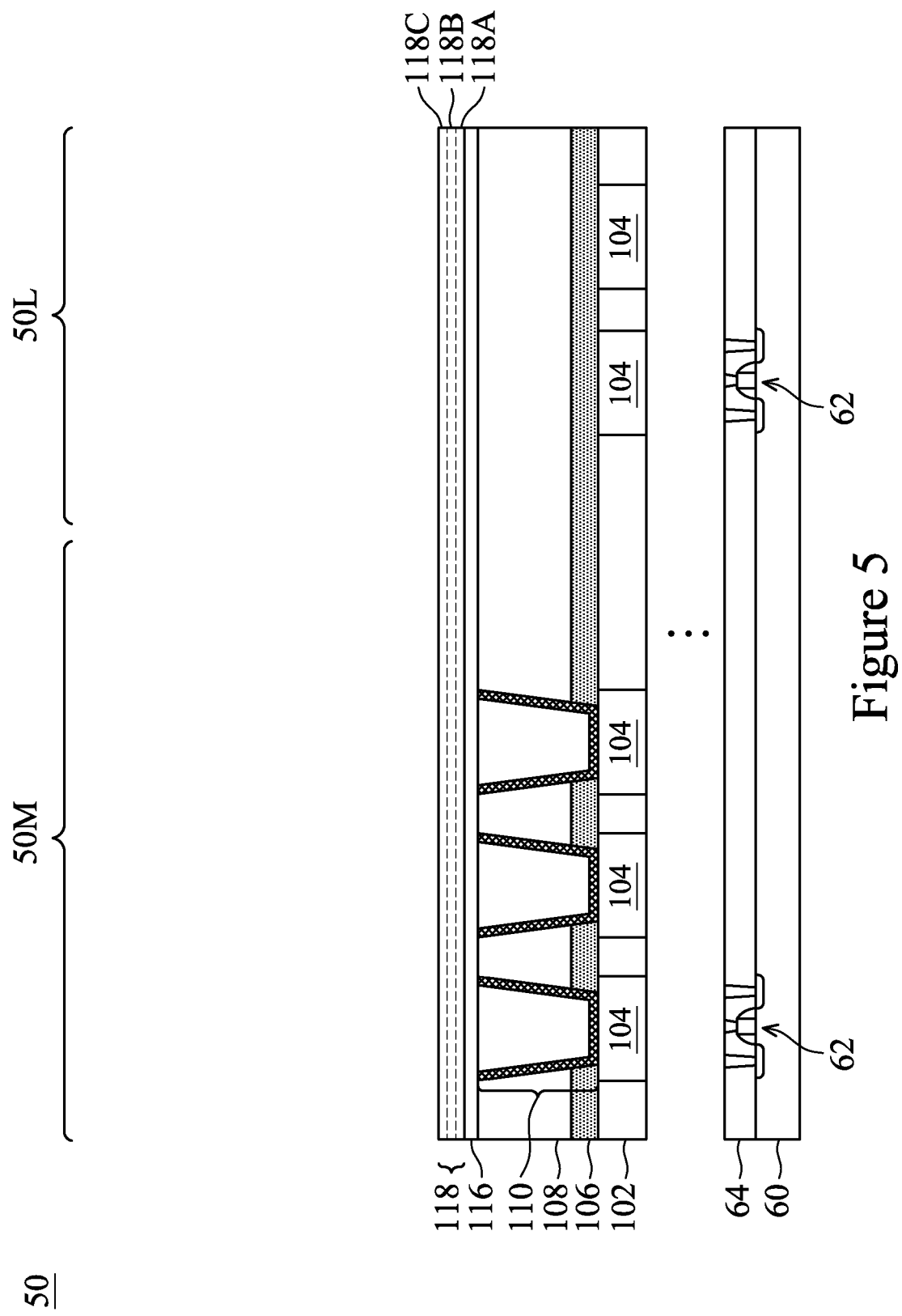

In FIG. 5, the reference layer(s) 118C are formed on the seed layer 118B. The reference layer(s) 118C are formed of ferromagnetic materials, such as cobalt (Co), iron (Fe), iron-boron (FeB), cobalt-iron-boron (CoFeB), combinations thereof, multilayers thereof, or the like. The reference layer(s) 118C may be formed of a plurality of different ferromagnetic and nonmagnetic sublayers, which may be referred to as flux-closure layer(s). In some embodiments, the flux-closure layer(s) include hard-biasing layers, an antiparallel-coupling layer, and reference layers. During operation, antiparallel coupling occurs across the antiparallel-coupling layer, thereby orienting the magnetizations of the hard-biasing layers and the reference layers in antiparallel directions and forming a flux closure with a small net magnetization. Stray fields emitting from the flux closure into the free layer(s) 118E (discussed further below) thus become sufficiently negligible such that the magnetization of the free layer(s) 118E can freely switch. In other words, the free layer(s) 118E have a lesser coercivity than the flux-closure layer(s). The reference layer(s) 118C are conformally formed, and may be formed using CVD, PVD, ALD, electro-chemical plating, electroless plating, or the like.

As an example to form the reference layer(s) 118C, in step 204 of the method 200, the layers can be deposited by DC sputtering. Specifically, a DC sputtering module is used to deposit cobalt and platinum laminates, e.g., [Co/Pt]xn/Co, with n representing a laminate number that can be in the range of about 2 to about 6, thus forming the hard-biasing layers. The cobalt sublayers can each have a thickness in the range of about 0.1 nm to about 0.4 nm, and the platinum sublayers can each have a thickness in the range of about 0.1 nm to about 0.4 nm. The top cobalt sublayer of the laminate can each have a thickness in the range of about 0.4 nm to about 1.2 nm. A DC sputtering module is then used to deposit an iridium layer, thus forming the antiparallel-coupling layer. The iridium layer can have a thickness in the range of about 0.4 nm to about 0.6 nm. A DC sputtering module is then used to deposit a cobalt layer, a molybdenum layer on the cobalt layer, and an iron-boron layer on the molybdenum layer, thus forming the reference layers. The cobalt layer can have a thickness in the range of about 0.4 nm to about 0.8 nm, the molybdenum layer can have a thickness in the range of about 0.2 nm to about 0.4 nm, and the iron-boron layer can have a thickness in the range of about 0.6 nm to about 1.6 nm. In some embodiments, the same DC sputtering module is used to deposit each of the reference layer(s) 118C, e.g., each of the hard-biasing layers, the antiparallel-coupling layer, and the reference layers. For example, a DC sputtering module 306 of the processing tool 300 can be used to deposit each of the layers. The DC sputtering module 306 may be a multiple-target module that is capable of sputtering the materials for each of the desired layers. DC sputtering of ferromagnetic materials can be performed at a lower cost and a higher deposition rate than other sputtering techniques, such as RF sputtering.

Figure 6:
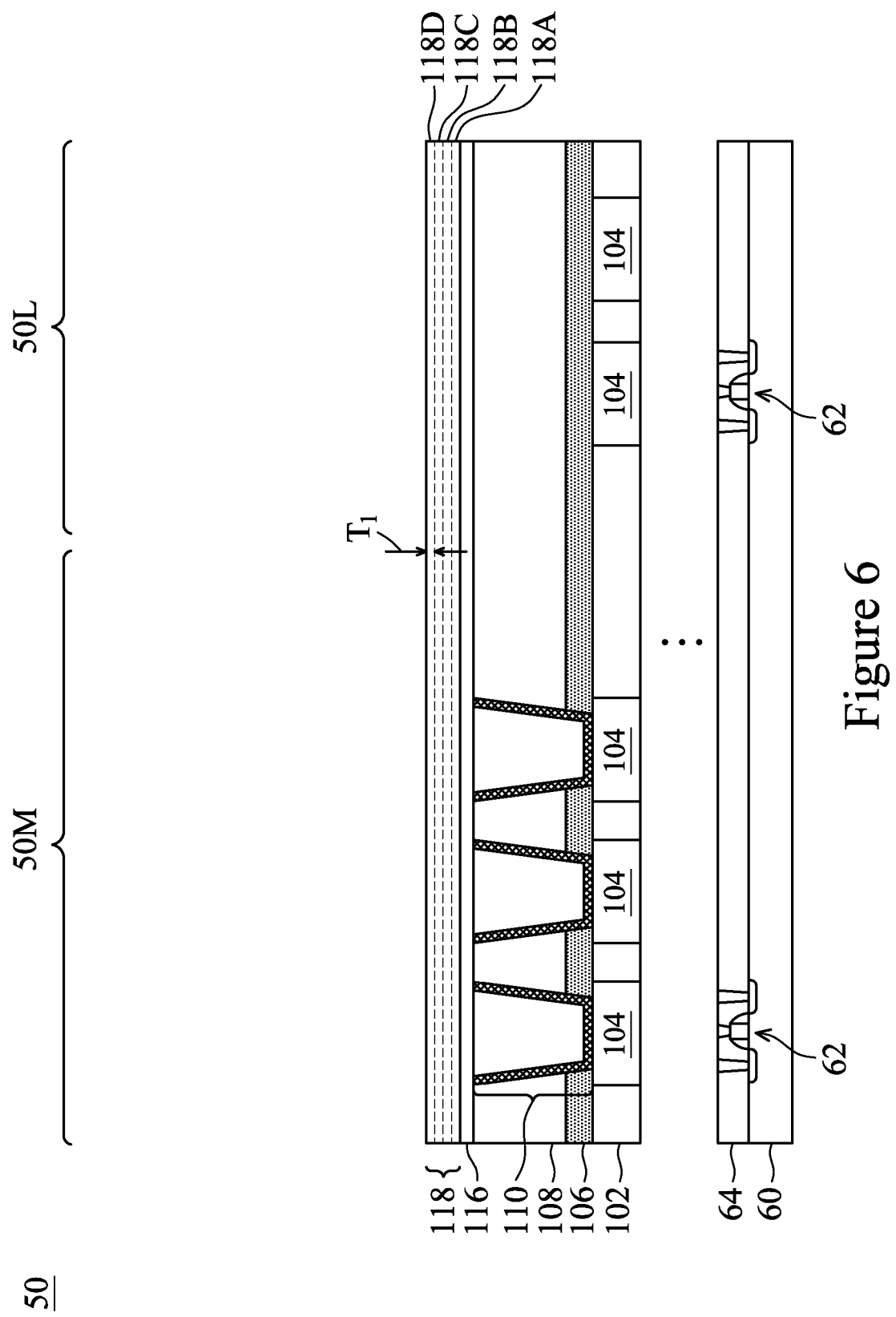

In FIG. 6, the tunnel barrier layer 118D is formed on the reference layer(s) 118C. The tunnel barrier layer 118D is formed of a dielectric material, such as magnesium oxide (MgO), aluminum nitride (AlN), aluminum oxide (AlO), combinations thereof, multilayers thereof, or the like. The tunnel barrier layer 118D is conformally formed, and may be formed using CVD, PVD, ALD, or the like.

As an example to form the tunnel barrier layer 118D, in step 206 of the method 200, the layer can be deposited by RF sputtering. Specifically, a RF sputtering module is used to deposit a magnesium oxide layer, thus forming the tunnel barrier layer 118D. The magnesium oxide layer (e.g., the tunnel barrier layer 118D) can have a thickness $T_1$ in the range of about 0.6 nm to about 1.2 nm. During RF sputtering, a wafer is placed beneath a target in the RF sputtering module. An inert gas is flowed into the RF sputtering module. RF power is applied to the target to activate the inert gas to a plasma state and bombard the target with ionized gas molecules, thus causing atoms from the target to be sputtered on the wafer being processed. Each cycle of the applied RF power includes a bombardment cycle (where the target material is bombarded with ions) and a cleaning cycle (where electrons are attracted to the target material to clean it of ion buildup).

In some embodiments, a pasting process is performed in the RF sputtering module before depositing the magnesium oxide layer. The pasting process can be, e.g., a metallic pasting process, performed by sputtering a metal such as tantalum on sidewalls of the chamber of the RF sputtering module. Sputtering a metal on the surfaces of the chamber (e.g., over the undesired dielectric material) helps reduce negative effects that can be caused by undesired dielectric material building up on inner surfaces of the chamber after repeated deposition steps. In addition, the sputtered metal on the surfaces of the chamber can induce gettering effects, which help reduce vapor pressures in the chamber, thereby improving properties of the magnesium oxide layer. In some embodiments, the same RF sputtering module is used to both paste the chamber and deposit the magnesium oxide layer. For example, a RF sputtering module 308 of the processing tool 300 can be used to paste and sputter. The RF sputtering module 308 may be a two-target module that is capable of sputtering both magnesium oxide and the pasting metal.

In some embodiments, magnesium oxide is deposited by bombarding a magnesium oxide target with ions. Argon can be flowed into the RF sputtering module 308 at a low flow rate, such as a flow rate in the range of about 20 sccm to about 35 sccm, and activated to a plasma state. Flowing argon at a low flow rate can reduce the deposition rate by creating less plasma, thus reducing the quantity of ions bombarded on the target. The deposition rate of the RF sputtering module 308 can be lower than the deposition rates of the DC sputtering modules 304, 306, 314, 316, 318. Reducing the deposition rate and performing cleaning cycles during RF sputtering avoids ion buildup on the target, which can help avoid deposition of undesirable pure magnesium byproducts. Reducing the amount of magnesium byproducts when depositing the tunnel barrier layer 118D helps the resulting MTJ elements 134 (see FIG. 2) be free from undesired conductive materials, thus retaining their desired high resistance ($R_{AP}$) and low resistance ($R_P$) codes. The resistances of the resulting MTJ elements 134 (see FIG. 2) can thus be more uniform across the MRAM cells 58 of the MRAM array 52 (see FIG. 1). However, the oxygen concentration of the deposited magnesium oxide layer is constrained when depositing magnesium oxide by RF sputtering. Specifically, preferential sputtering of magnesium can occur, which results in the oxygen concentration of the tunnel barrier layer 118D being less than that of the magnesium oxide target. In some embodiments, a stoichiometric ratio of oxygen to magnesium of the magnesium oxide target is greater than a stoichiometric ratio of oxygen to magnesium of the deposited magnesium oxide layer. For example, the magnesium oxide target can have a stoichiometric ratio of oxygen to magnesium that is equal to about 1. Similarly, the deposited magnesium oxide layer can have a stoichiometric ratio of oxygen to magnesium that is less than or equal to about 1, such as in the range of about 0.95 to about 1.05. In some embodiments, the tunnel barrier layer 118D has substantially equal atomic concentrations of magnesium and oxygen. An oxygen deficiency during RF sputtering can cause undesirable pure magnesium byproducts to remain, which may cause issues such as electrical shorting, degraded PMA, and the like.

Although depositing magnesium oxide by RF sputtering can reduce the amount of undesirable magnesium byproducts, the oxygen concentration of the deposited magnesium oxide layer is constrained by the original oxygen concentration of the magnesium oxide target. In some embodiments, the magnesium oxide target is oxygen deficient, and as such, the deposited magnesium oxide layer can have a low concentration of oxygen by atomic percent, and can be only partially oxidized magnesium. For example, the deposited magnesium oxide layer can have a stoichiometric ratio of oxygen to magnesium that is less than or equal to about 1, such as in the range of about 0.95 to about 1.05. In some embodiments, the tunnel barrier layer 118D has a greater atomic concentration of magnesium than oxygen. In some embodiments, the tunnel barrier layer 118D has substantially equal atomic concentrations of magnesium and oxygen.

Optionally, in step 208 of the method 200, the tunnel barrier layer 118D is annealed. Annealing can increase the thickness $T_1$ of the tunnel barrier layer 118D. As an example to the annealing, a heating module 310 of the processing tool 300 can be used to heat the wafer being processed, after which a cooling module 312 of the processing tool 300 can be used to cool off the heated wafer and help speed up processing. In an embodiment, the annealing can be performed at a temperature in the range of about 350° C. to about 425° C., and for a duration in the range of about 30 minutes to about 200 minutes, which allows the thickness of the tunnel barrier layer 118D to increase to a thickness $T_1$ in the range of about 0.7 nm to about 1.0 nm. When the tunnel barrier layer 118D is formed by RF sputtering, increasing its thickness can help increase the relative change of resistance between the high resistance ($R_{AP}$) and a low resistance ($R_P$) states of the resulting MTJ elements 134 (see FIG. 2), which can improve the write error rate (WER) and read error rate (RER) of the MRAM cells 58 (see FIG. 1).

Figure 7:
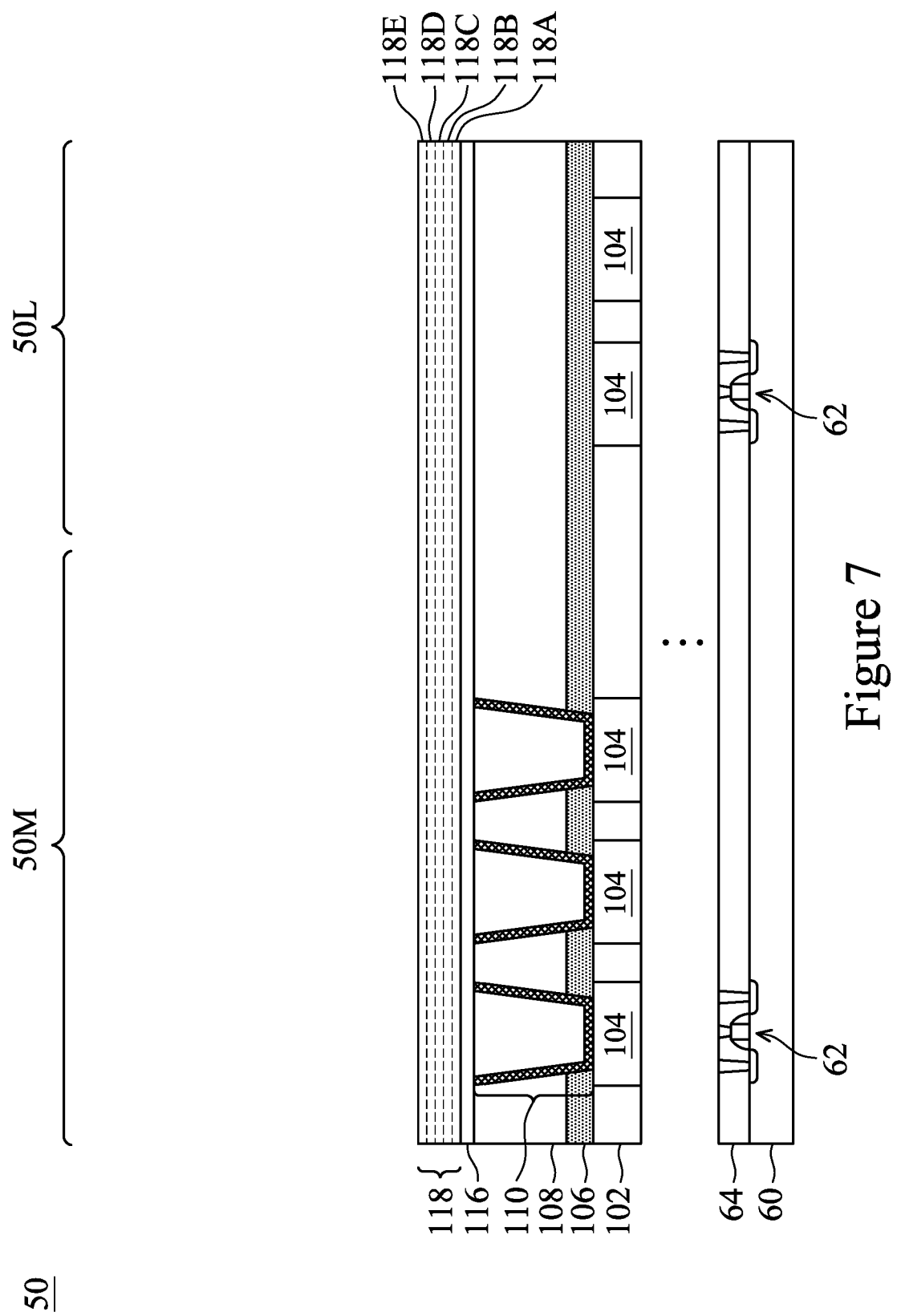

In FIG. 7, the free layer(s) 118E are formed on the tunnel barrier layer 118D. The free layer(s) 118E are formed of ferromagnetic materials, such as cobalt (Co), iron (Fe), iron-boron (FeB), cobalt-iron-boron (CoFeB), combinations thereof, multilayers thereof, or the like. The free layer(s) 118E are conformally formed, and may be formed using CVD, PVD, ALD, electro-chemical plating, electroless plating, or the like.

As an example to form the free layer(s) 118E, in step 210 of the method 200, the layers can be deposited by DC sputtering. Specifically, a DC sputtering module is used to deposit a first cobalt-iron-boron layer, a molybdenum layer on the first cobalt-iron-boron layer, and a second cobalt-iron-boron layer on the molybdenum layer, thus forming the free layer(s) 118E. The first cobalt-iron-boron layer can have a thickness in the range of about 0.8 nm to about 1.4 nm, the molybdenum layer can have a thickness in the range of about 0.2 nm to about 0.4 nm, and the second cobalt-iron-boron layer can have a thickness in the range of about 0.8 nm to about 1.4 nm. In some embodiments, the first cobalt-iron-boron layer is doped with more boron than the second cobalt-iron-boron layer. In some embodiments, the same DC sputtering module is used to deposit each of the free layer(s) 118E. For example, a DC sputtering module 314 of the processing tool 300 can be used to deposit each of the layers. The DC sputtering module 314 may be a multiple-target module that is capable of sputtering the materials for each of the desired layers. DC sputtering of ferromagnetic materials can be performed at a lower cost and a higher deposition rate than other sputtering techniques, such as RF sputtering.

The magnetization of the free layer(s) 118E can freely switch, and thus the resistances of the resulting MTJ elements 134 (see FIG. 2) are accordingly programmable. Specifically, the resistances of the MTJ elements 134 can be changed between a high resistance ($R_{AP}$) and a low resistance ($R_P$). When the magnetization of the free layer(s) 118E is parallel to that of the reference layer(s) 118C, the MTJ element has a low resistance ($R_P$). When the magnetization of the free layer(s) 118E is antiparallel to that of the reference layer(s) 118C, the MTJ element has a high resistance ($R_{AP}$). As such, the resulting MTJ elements 134 can also be referred to as programmable resistance elements. The MTJ elements 134 are perpendicular MTJ elements, e.g., the direction of magnetization is perpendicular to the major surface of the semiconductor substrate 60.

Figure 8:
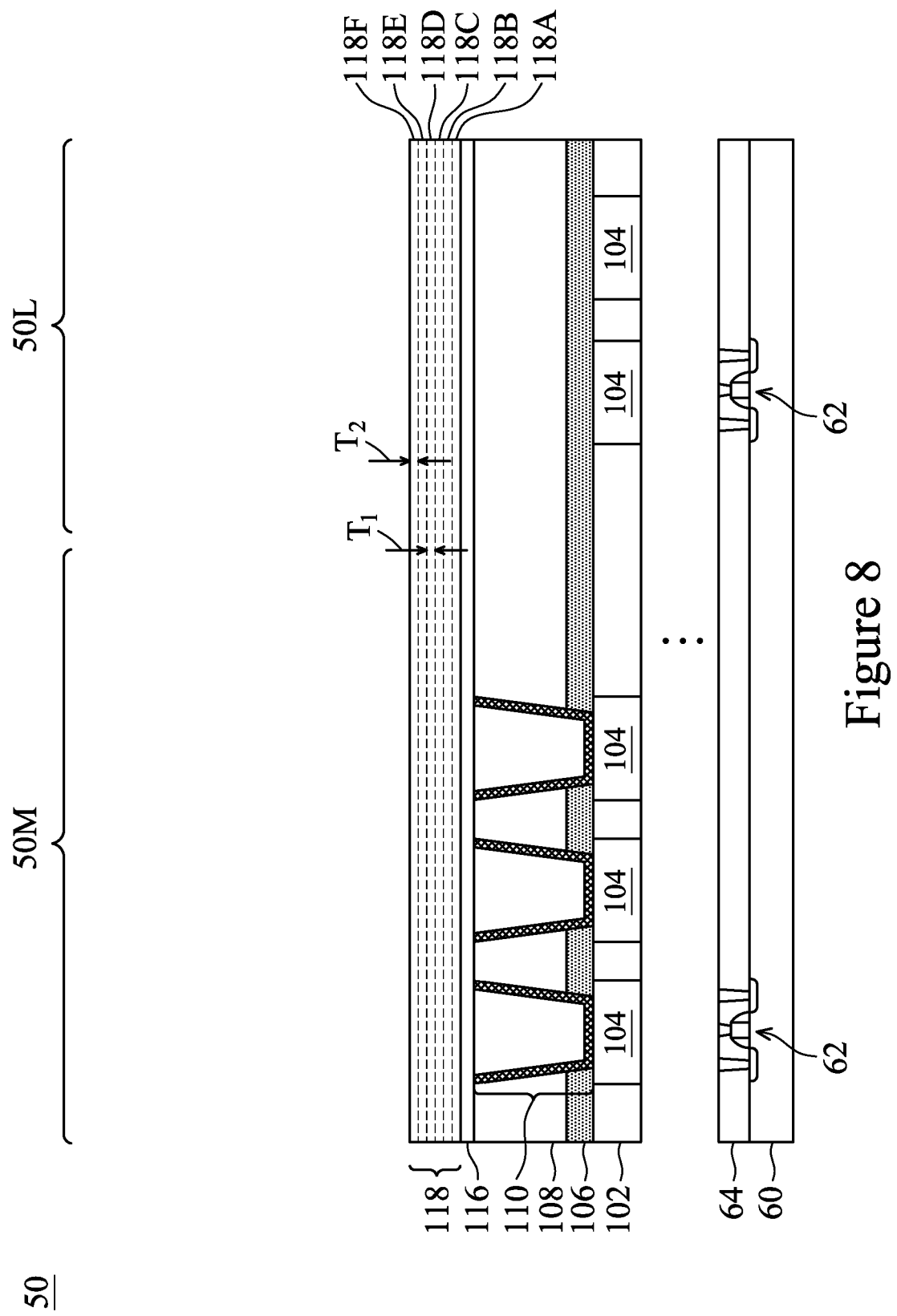

In FIG. 8, the cap layer 118F is formed on the free layer(s) 118E. The cap layer 118F is formed of a dielectric material, such as magnesium oxide (MgO), aluminum nitride (AlN), aluminum oxide (AlO), combinations thereof, multilayers thereof, or the like. The cap layer 118F is conformally formed, and may be formed using CVD, PVD, ALD, or the like.

As an example to form the cap layer 118F, in step 212 of the method 200, the layer is formed by multiple DC sputtering and oxidation steps. Specifically, in step 214 of the method 200, a DC sputtering module is used to deposit a pure magnesium sublayer. Next, in step 216 of the method 200, the deposited magnesium sublayer is oxidized in the DC sputtering module to form a magnesium oxide layer. Steps 214 and 216 are repeated for a number of cycles (e.g., four cycles) until the magnesium oxide layer reaches a desired thickness, thus forming the cap layer 118F. Each of the steps are performed in the same DC sputtering module, and are performed in-situ, e.g., without breaking a vacuum in the sputtering module between each sputtering and oxidation step. For example, a DC sputtering module 316 of the processing tool 300 can be used to deposit the magnesium oxide layer. The DC sputtering module 316 may be a one-target module that can sputter magnesium oxide without contamination of other targets. FIGS. 9A through 9E are cross-sectional views of intermediate stages in the manufacturing of the cap layer 118F, in accordance with some embodiments.

In FIG. 9A, the DC sputtering module is used to deposit a first magnesium sublayer $118F_1$. The first magnesium sublayer $118F_1$ can be deposited to a thickness in the range of about 0.2 nm to about 0.4 nm. The first magnesium sublayer $118F_1$ is then oxidized to form a magnesium oxide sublayer. In some embodiments, oxidation is accomplished by flowing oxygen gas into the DC sputtering module (e.g., over the first magnesium sublayer 118F$_1$) at a flow rate in the range of about 8 sccm to about 40 sccm, for a duration in the range of about 10 seconds to about 40 seconds. Oxidizing at a large flow rate and for a long duration helps ensure the first magnesium sublayer 118F$_1$ is sufficiently oxidized, particularly when the first magnesium sublayer 118F$_1$ is thick.

In FIG. 9B, the DC sputtering module is used to deposit a second magnesium sublayer 118F$_2$. The second magnesium sublayer 118F$_2$ can be deposited to a thickness in the range of about 0.08 nm to about 0.24 nm. The second magnesium sublayer 118F$_2$ is then oxidized to form a magnesium oxide sublayer. In some embodiments, oxidation is accomplished by flowing oxygen gas into the DC sputtering module (e.g., over the second magnesium sublayer 118F$_2$) at a flow rate in the range of about 1 sccm to about 20 sccm, for a duration in the range of about 10 seconds to about 40 seconds. Notably, the second magnesium sublayer 118F$_2$ is deposited to a lesser thickness than the first magnesium sublayer 118F$_1$, and is oxidized at a lesser oxygen flow rate than the first magnesium sublayer 118F$_1$. Because the second magnesium sublayer 118F$_2$ is thin, it can be more easily oxidized than the first magnesium sublayer 118F$_1$.

In FIG. 9C, the DC sputtering module is used to deposit a third magnesium sublayer 118F$_3$. The third magnesium sublayer 118F$_3$ can be deposited to a thickness in the range of about 0.08 nm to about 0.24 nm. The third magnesium sublayer 118F$_3$ is then oxidized to form a magnesium oxide sublayer. In some embodiments, oxidation is accomplished by flowing oxygen gas into the DC sputtering module (e.g., over the third magnesium sublayer 118F$_3$) at a flow rate in the range of about 1 sccm to about 20 sccm, for a duration in the range of about 10 seconds to about 40 seconds. Notably, the third magnesium sublayer 118F$_3$ is deposited to a lesser thickness than the first magnesium sublayer 118F$_1$, and is oxidized at a lesser oxygen flow rate than the first magnesium sublayer 118F$_1$. In some embodiments, the third magnesium sublayer 118F$_3$ is deposited to the same thickness and oxidized in the same manner as the second magnesium sublayer 118F$_2$. Because the third magnesium sublayer 118F$_3$ is thin, it can be more easily oxidized than the first magnesium sublayer 118F$_1$.

In FIG. 9D, the DC sputtering module is used to deposit a fourth magnesium sublayer 118F$_4$. The fourth magnesium sublayer 118F$_4$ can be deposited to a thickness in the range of about 0.08 nm to about 0.24 nm. The fourth magnesium sublayer 118F$_4$ is then oxidized to form a magnesium oxide sublayer. In some embodiments, oxidation is accomplished by flowing oxygen gas into the DC sputtering module (e.g., over the fourth magnesium sublayer 118F$_4$) at a flow rate in the range of about 100 sccm to about 1000 sccm, for a duration in the range of about 10 seconds to about 40 seconds. The fourth magnesium sublayer 118F$_4$ is deposited to the same thickness as the second magnesium sublayer 118F$_2$ and the third magnesium sublayer 118F$_3$. The fourth magnesium sublayer 118F$_4$ is oxidized at a greater oxygen flow rate than each of the first magnesium sublayer 118F$_1$, the second magnesium sublayer 118F$_2$, and the third magnesium sublayer 118F$_3$. The fourth magnesium sublayer 118F$_4$ can also be oxidized for a longer duration than each of the first magnesium sublayer 118F$_1$, the second magnesium sublayer 118F$_2$, and the third magnesium sublayer 118F$_3$. Oxidizing at a large flow rate and for a long duration helps ensure the first magnesium sublayer 118F$_1$, the second magnesium sublayer 118F$_2$, the third magnesium sublayer 118F$_3$, and the fourth magnesium sublayer 118F$_4$ are sufficiently oxidized.

In FIG. 9E, the DC sputtering module is used to deposit a fifth magnesium sublayer 118F$_5$. The fifth magnesium sublayer 118F$_5$ can be deposited to a thickness in the range of about 0.08 nm to about 0.24 nm. Forming the fifth magnesium sublayer 118F$_5$ may protect underlying layers in subsequent processing. The fifth magnesium sublayer 118F$_5$ is not separately oxidized, but can be oxidized by diffusion from the fourth magnesium sublayer 118F$_4$.

Although the sublayers of the cap layer 118F are discretely deposited and oxidized, the cap layer 118F is a single uniform dielectric material composition after formation is complete. Referring back to FIG. 8, forming the cap layer 118F by repeated deposition and oxidation of magnesium allows the composition of the cap layer 118F to be finely controlled, and allows the cap layer 118F to be formed with more oxygen than other deposition techniques, such as reactive sputtering. Specifically, the cap layer 118F can be formed of magnesium oxide with a large concentration of oxygen by atomic percent, and can be fully oxidized magnesium, or at least can be more oxidized than the tunnel barrier layer 118D. In other words, the tunnel barrier layer 118D is formed of a first composition of magnesium and oxygen, and the cap layer 118F is formed of a second composition of magnesium and oxygen, with the second composition having a greater atomic concentration of oxygen and a lesser atomic concentration of magnesium than the first composition. In an embodiment, the cap layer 118F is deposited to a thickness T$_2$ in the range of about 0.4 nm to about 1.0 nm. The thickness T$_2$ of the cap layer 118F is less than the thickness T$_1$ of the tunnel barrier layer 118D. In an embodiment, the cap layer 118F has a stoichiometric ratio of oxygen to magnesium that is greater than about 1, such as in the range of about 1.0 to about 1.2. In other words, the magnesium oxide of the cap layer 118F has a greater atomic concentration of oxygen than magnesium when repeated deposition and oxidation is used to deposit the cap layer 118F. In some embodiments, the cap layer 118F has a greater atomic concentration of oxygen and a lesser atomic concentration of magnesium than the tunnel barrier layer 118D. Put another way, the cap layer 118F has a first stoichiometric ratio of oxygen to magnesium, and the tunnel barrier layer 118D has a second stoichiometric ratio of oxygen to magnesium, with the first stoichiometric ratio being greater than the second stoichiometric ratio. Further, the cap layer 118F can have a uniform oxygen concentration throughout, or at least can have a more uniform oxygen concentration than the tunnel barrier layer 118D. Forming the cap layer 118F of fully oxidized magnesium allows the cap layer 118F to act as a protection layer to reduce damage to the free layer(s) 118E by etching in a subsequent process for patterning the MTJ stack 118. Further, forming the cap layer 118F of fully oxidized magnesium allows the perpendicular magnetic anisotropy (PMA) of the resulting MTJ elements 134 (see FIG. 2) to be increased. Increasing the PMA of the resulting MTJ elements 134 helps increase the relative change of resistance between the high resistance (R$_{AP}$) and a low resistance (R$_P$) states of the resulting MTJ elements 134, which can improve the write error rate (WER) and read error rate (RER) of the MRAM cells 58 (see FIG. 1).

Figure 10:
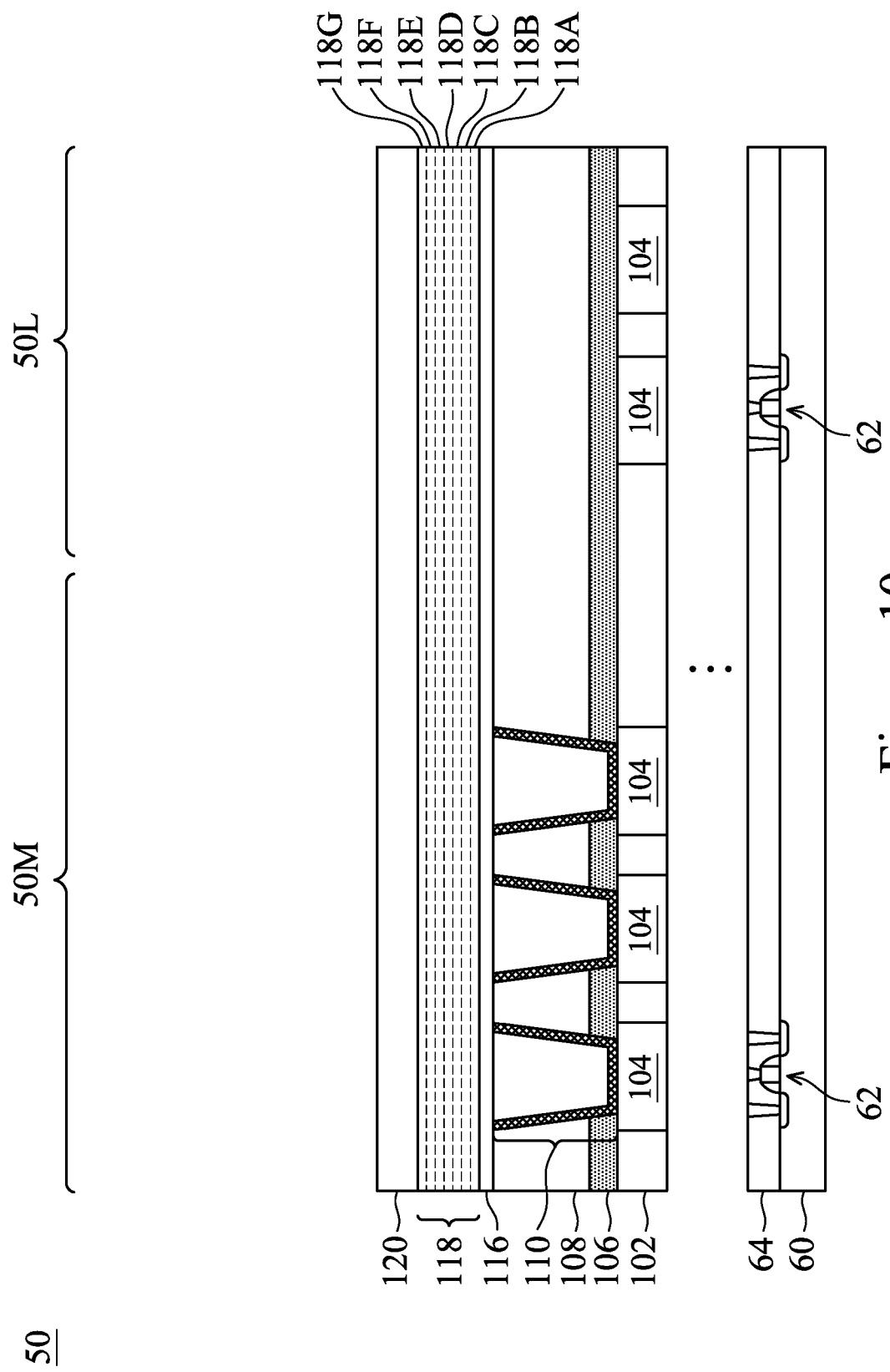

In FIG. 10, the overcoat layer(s) 118G are formed on the cap layer 118F. The overcoat layer(s) 118G are formed of ferromagnetic materials, such as cobalt (Co), iron (Fe), iron-boron (FeB), cobalt-iron-boron (CoFeB), combinations thereof, multilayers thereof, or the like. The overcoat layer(s) 118G are conformally formed, and may be formed using CVD, PVD, ALD, electro-chemical plating, electroless plating, or the like.

The top electrode layer 120 is formed on the overcoat layer(s) 118G. The top electrode layer 120 is formed of a conductive material such as titanium (Ti), tantalum (Ta), aluminum (Al), tungsten (W), platinum (Pt), nickel (Ni), chromium (Cr), ruthenium (Ru), nitrides thereof, combinations thereof, multilayers thereof, or the like. The top electrode layer 120 is conformally formed, and may be formed using CVD, PVD, ALD, electro-chemical plating, electroless plating, or the like.

As an example to form the overcoat layer(s) 118G and the top electrode layer 120, in step 218 of the method 200, the layers can be deposited by DC sputtering. Specifically, a DC sputtering module is used to deposit a cobalt-iron-boron layer, a tantalum layer on the cobalt-iron-boron layer, and a ruthenium layer on the tantalum layer, thus forming the overcoat layer(s) 118G. The cobalt-iron-boron layer can have a thickness in the range of about 0.2 nm to about 0.4 nm, the tantalum layer can have a thickness in the range of about 1.5 nm to about 4 nm, and the ruthenium layer can have a thickness in the range of about 3 nm to about 6 nm. Forming a the cobalt-iron-boron layer between the cap layer 118F and the tantalum layer causes the resulting MTJ elements 134 (see FIG. 2) to exhibits perpendicular magnetic anisotropy (PMA), thereby enhancing the polarization of conduction electrons and improving tunnel magnetoresistance (TMR) effects.

A DC sputtering module is then used to deposit a titanium nitride layer, thus forming the top electrode layer 120. The titanium nitride layer (e.g., the top electrode layer 120) can have a thickness in the range of about 60 nm to about 100 nm. In some embodiments, the same DC sputtering module is used to deposit each of the overcoat layer(s) 118G and the top electrode layer 120. For example, a DC sputtering module 318 of the processing tool 300 can be used to deposit each of the layers. The DC sputtering module 318 may be a multiple-target module that is capable of sputtering the materials for each of the desired layers. DC sputtering of conductive and ferromagnetic materials can be performed at a lower cost and a higher deposition rate than other sputtering techniques, such as RF sputtering.

It should be appreciated that the materials and the structure of the MTJ stack 118 may have many variations, which are also within the scope of the present disclosure. For example, the layers 118A, 118B, 118C, 118D, 118E, 118F, 118G may be formed in an order inversed from that described above. Accordingly, the overcoat layer(s) 118G may be at the bottom of the MTJ stack 118, and the ground layer 118A may be at the top of the MTJ stack 118.

Figure 11:
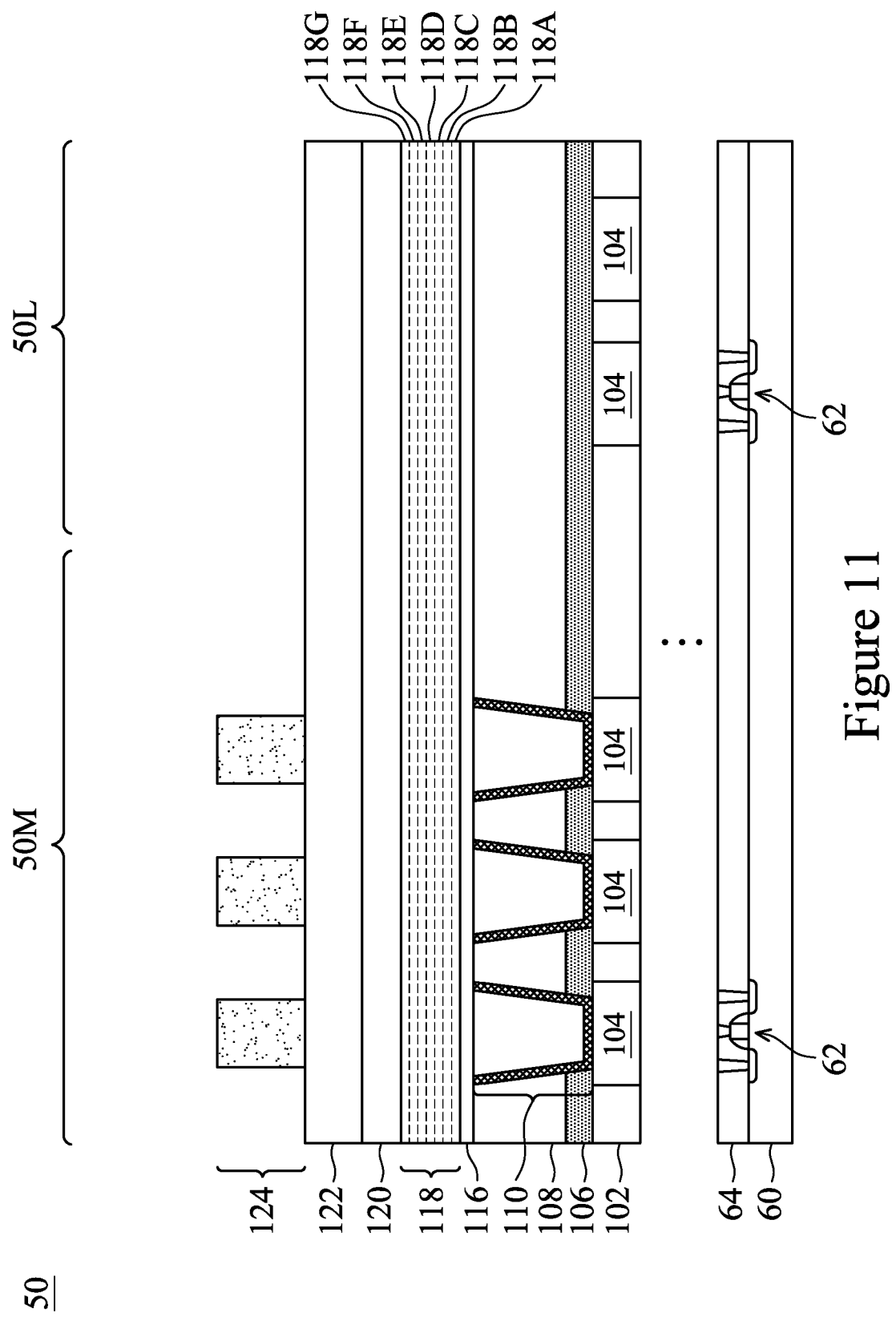

In FIG. 11, one or more masks are formed over the top electrode layer 120. The masks will be used to simultaneously pattern the various layers and form MRAM cells. In some embodiments, the one or more masks may comprise one or more hard masks, a trilayer mask, a combination thereof, or the like. For example, a hard mask layer 122 can be formed over the top electrode layer 120 and a photosensitive mask 124 can be formed over the hard mask layer 122. In some embodiments, the hard mask layer 122 is formed of an oxide such as titanium oxide, silicon oxide, a combination thereof, or the like. The photosensitive mask 124 may be a photoresist, such as a single-layer photoresist, a bilayer photoresist, a trilayer photoresist, or the like. The photosensitive mask 124 is formed in the memory region 50M, with the pattern of the photosensitive mask 124 corresponding to the pattern of the subsequently formed MRAM cells.

Figure 12:
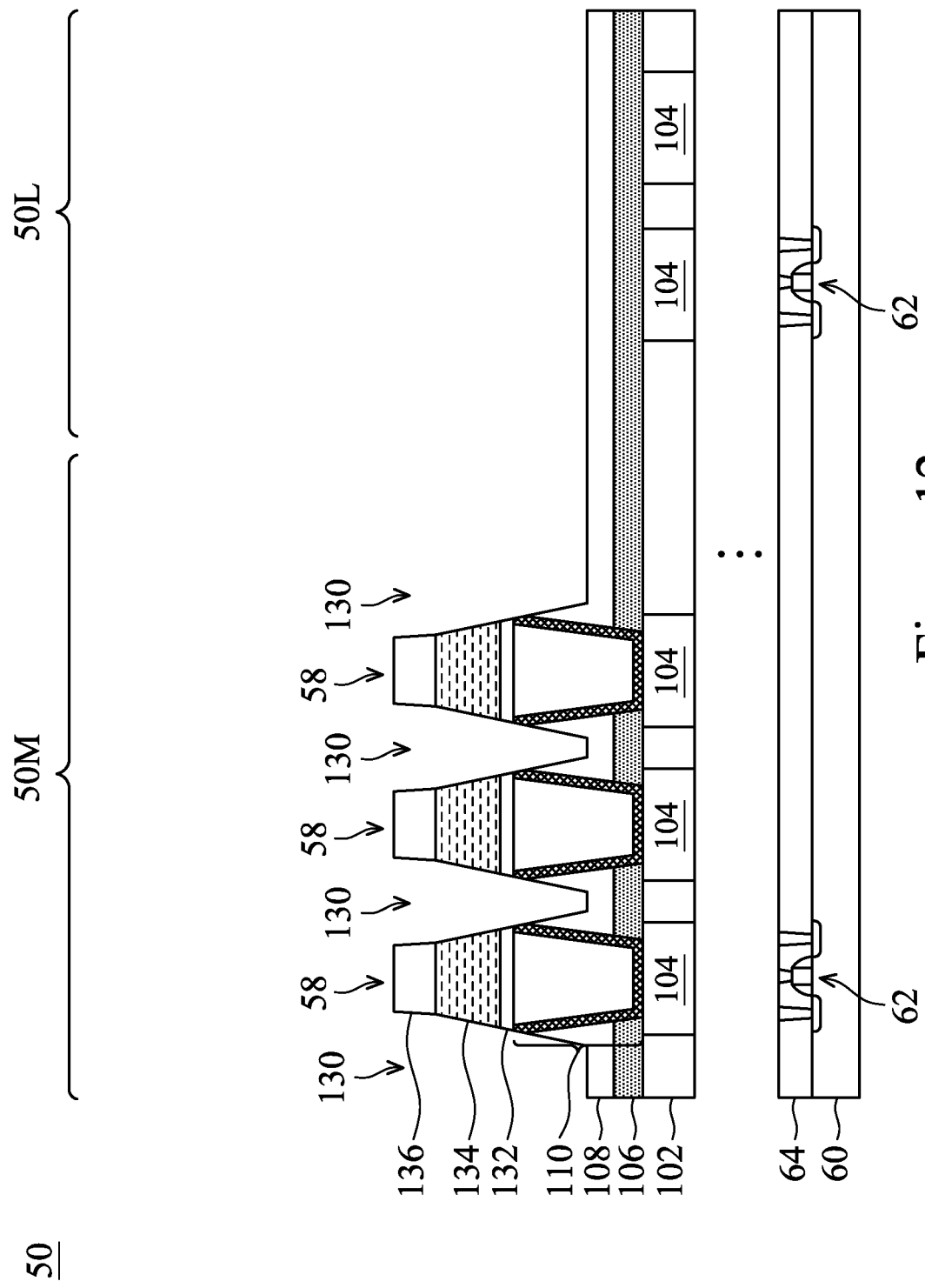

In FIG. 12, the photosensitive mask 124 is used as an etching mask to etch and pattern the hard mask layer 122, thus forming a patterned hard mask. The patterned hard mask is then used as an etching mask to etch and pattern the top electrode layer 120, the MTJ stack 118, and the bottom electrode layer 116. The patterning may include one or more etching processes, and can form recesses 130 in the IMD layer 108. The etching method may include a plasma etching method, such as ion beam etching (IBE). IBE offers a high level of precision (e.g., high anisotropism), which can help control the profile of the resulting MRAM cells. The etching may be implemented using glow discharge plasma (GDP), capacitive coupled plasma (CCP), inductively coupled plasma (ICP), or the like. The photosensitive mask 124 and hard mask layer 122 may be consumed in the etching process, or may be removed after the etching process.

The etching process forms the bottom electrodes 132, the MTJ elements 134, and the top electrodes 136, which together form the MRAM cells 58. Each MRAM cell 58 includes a bottom electrode 132, a MTJ element 134, and a top electrode 136, with the MTJ element 134 being disposed between the bottom electrode 132 and the top electrode 136. The bottom electrodes 132 comprise remaining portions of the bottom electrode layer 116. The MTJ elements 134 comprise remaining portions of the MTJ stack 118. The top electrodes 136 comprise remaining portions of the top electrode layer 120. In some embodiments, the etching process partially etches the IMD layer 108 and conductive vias 110. In such embodiments, the remaining portions of the IMD layer 108 have sloped sidewalls, and have trapezoidal shapes in the illustrated cross-section. After the etching process, the remaining portions of the IMD layer 108 in the logic region 50L can have a thickness in the range of about 3 nm to about 30 nm. The bottom electrodes 132, MTJ elements 134, and top electrodes 136 can also have sloped sidewalls, and have trapezoidal shapes in the illustrated cross-section.

Figure 13:
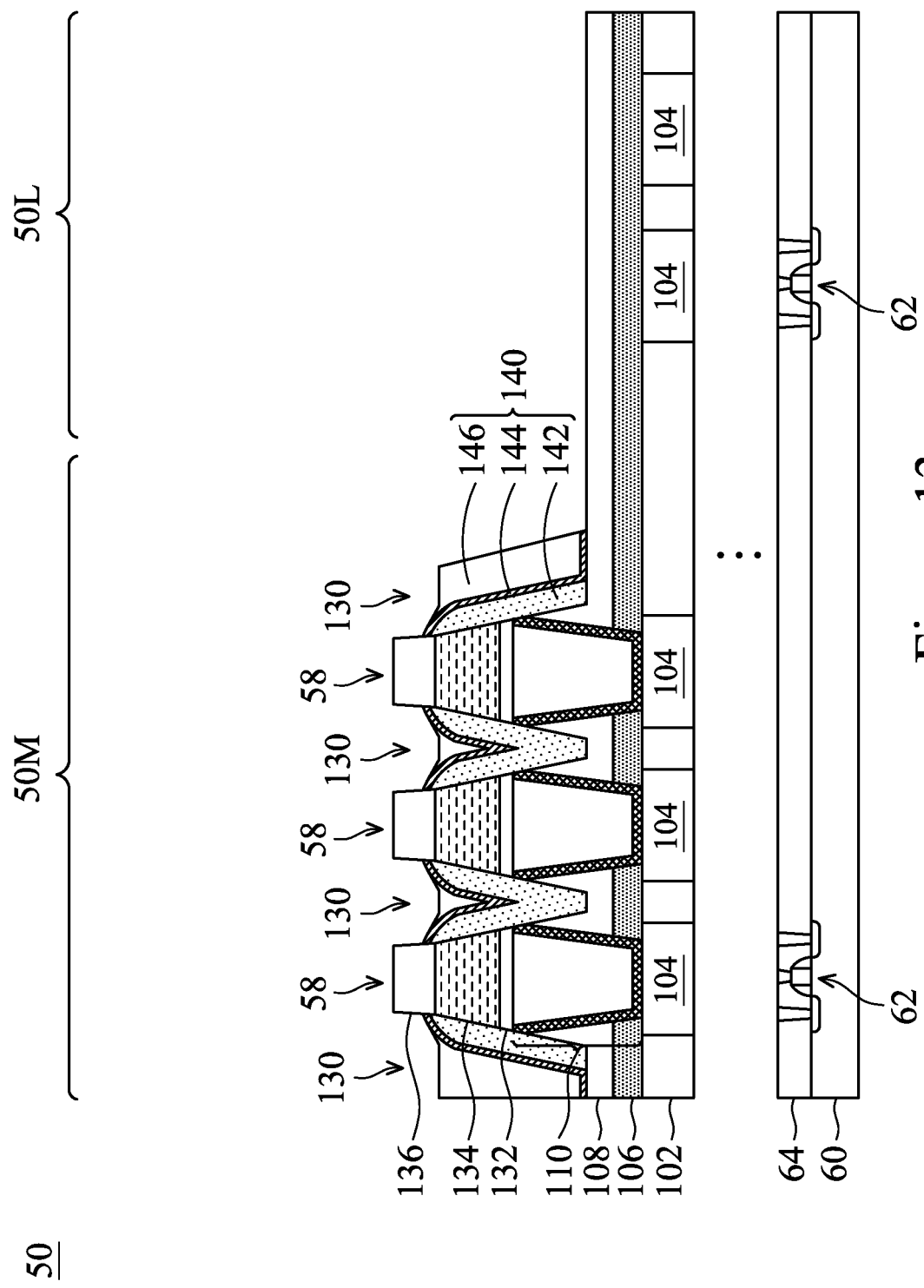

In FIG. 13, spacers 140 are formed on the sidewalls of the MRAM cells 58. The spacers 140 surround and protect the components of the MRAM cells 58. Specifically, the spacers 140 are disposed around the bottom electrodes 132 and the MTJ elements 134, and can be at least partially disposed around the top electrodes 136. The spacers 140 may be formed of an oxide (e.g., silicon oxide, aluminum oxide, etc.), a nitride (e.g., silicon nitride, aluminum nitride, etc.), a carbide (e.g., silicon carbide), combinations thereof (e.g., silicon oxynitride, silicon carbonitride, etc.), multilayers thereof, or the like.

In an embodiment where the spacers 140 comprise a multilayer, the spacers 140 comprise a passivation layer 142, a passivation layer 144, and an oxide layer 146. As an example to form the spacers 140, the passivation layer 142 can be conformally formed over the MRAM cells 58 and in the recesses 130. In some embodiments, the passivation layer 142 may comprise silicon oxide, silicon nitride, silicon oxynitride, silicon carbide, silicon carbonitride, a combination thereof, or the like, and may be formed using CVD, plasma-enhanced chemical vapor deposition (PECVD), ALD, plasma-enhanced atomic layer deposition (PEALD), PVD, a combination thereof, or the like. In some embodiments, the passivation layer 142 may reduce or prevent moisture (e.g., $H_2O$) diffusion into the MRAM cells 58 during subsequent processing. The passivation layer 142 is then patterned to expose portions of the top electrodes 136. In some embodiments, the patterning is a dry etching process, such as an anisotropic etching process. The patterning removes horizontal portions of the passivation layer 142. Subsequently, another passivation layer 144 is formed over the passivation layer 142. In some embodiments, the passivation layer 144 is formed of one of the candidate materials and methods for the passivation layer 142, but is formed of a different material than the passivation layer 142. For example, the passivation layer 142 can be formed of an oxide, e.g., silicon oxide, and the passivation layer 144 can be formed of a nitride, e.g., silicon nitride. The oxide layer 146 is then formed over the passivation layer 144. In some embodiments, the oxide layer 146 may comprise silicon oxide, or the like, and may be formed using CVD, PECVD, ALD, PEALD, a combination thereof, or the like. Subsequently, one or more dry etching processes are performed to etch the passivation layer 144 and the oxide layer 146 and to expose portions of the top electrodes 136. In some embodiments, the one or more dry etching processes are anisotropic etching processes and remove horizontal portions of the oxide layer 146. The remaining portions of the passivation layer 142, the passivation layer 144, and the oxide layer 146 form the spacers 140. The IMD layer 108 in the logic region 50L is exposed after the spacers 140 are patterned.

Figure 14:
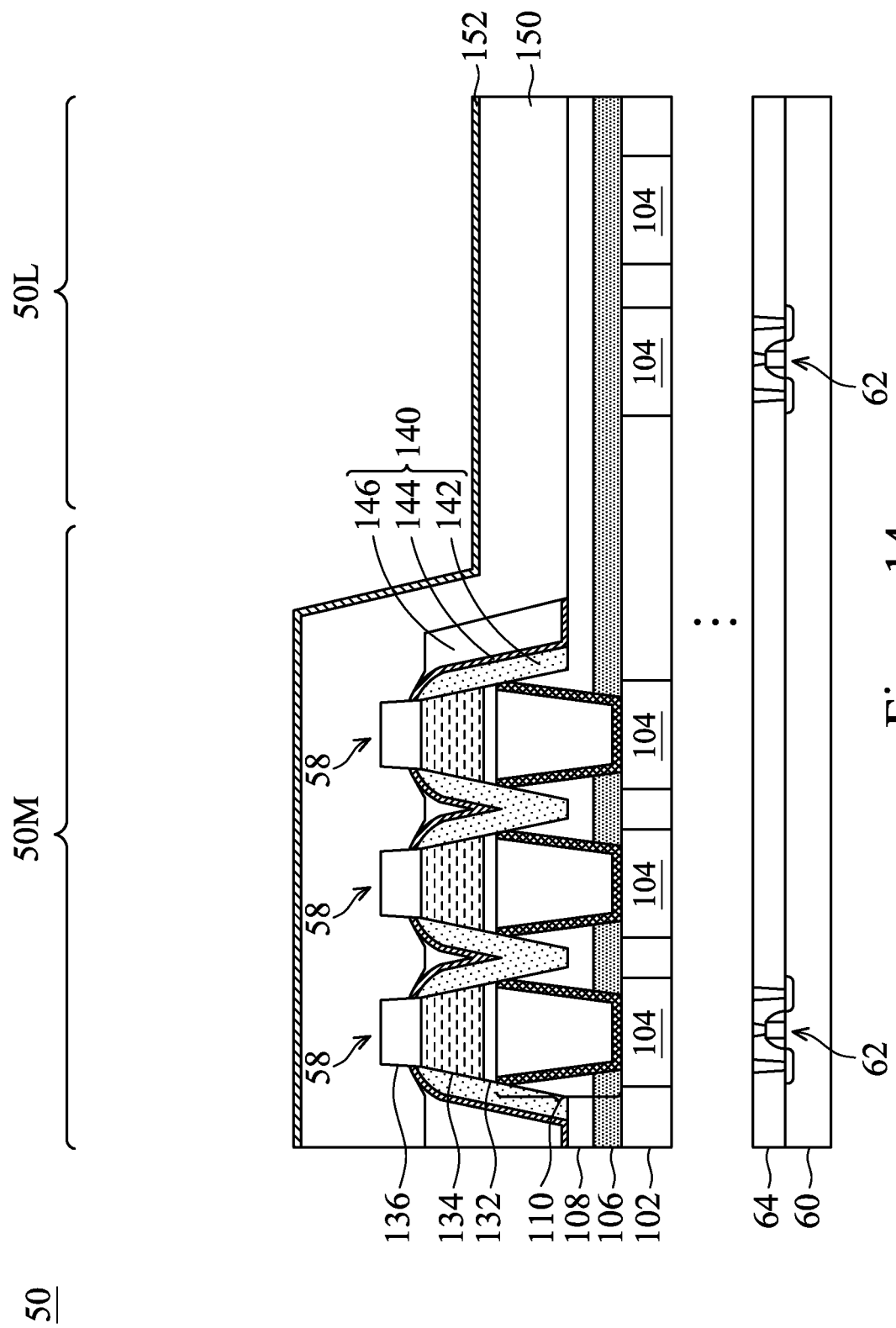

In FIG. 14, an IMD layer 150 is formed over the spacers 140, MRAM cells 58, and IMD layer 108. The IMD layer 150 is disposed on and around the spacers 140, and is disposed on and around the top electrodes 136. In some embodiments, the IMD layer 150 is formed using similar materials and methods as the IMD layer 108. An anti-reflective layer 152 is then formed on the IMD layer 150. The anti-reflective layer 152 may be a nitrogen-free anti-reflective layer (NFARL), and may be formed of a nitrogen-free dielectric material such as silicon oxycarbide. The IMD layer 150 and anti-reflective layer 152 will be used to protect the memory region 50M during subsequent processing of the logic region 50L.

Figure 15:
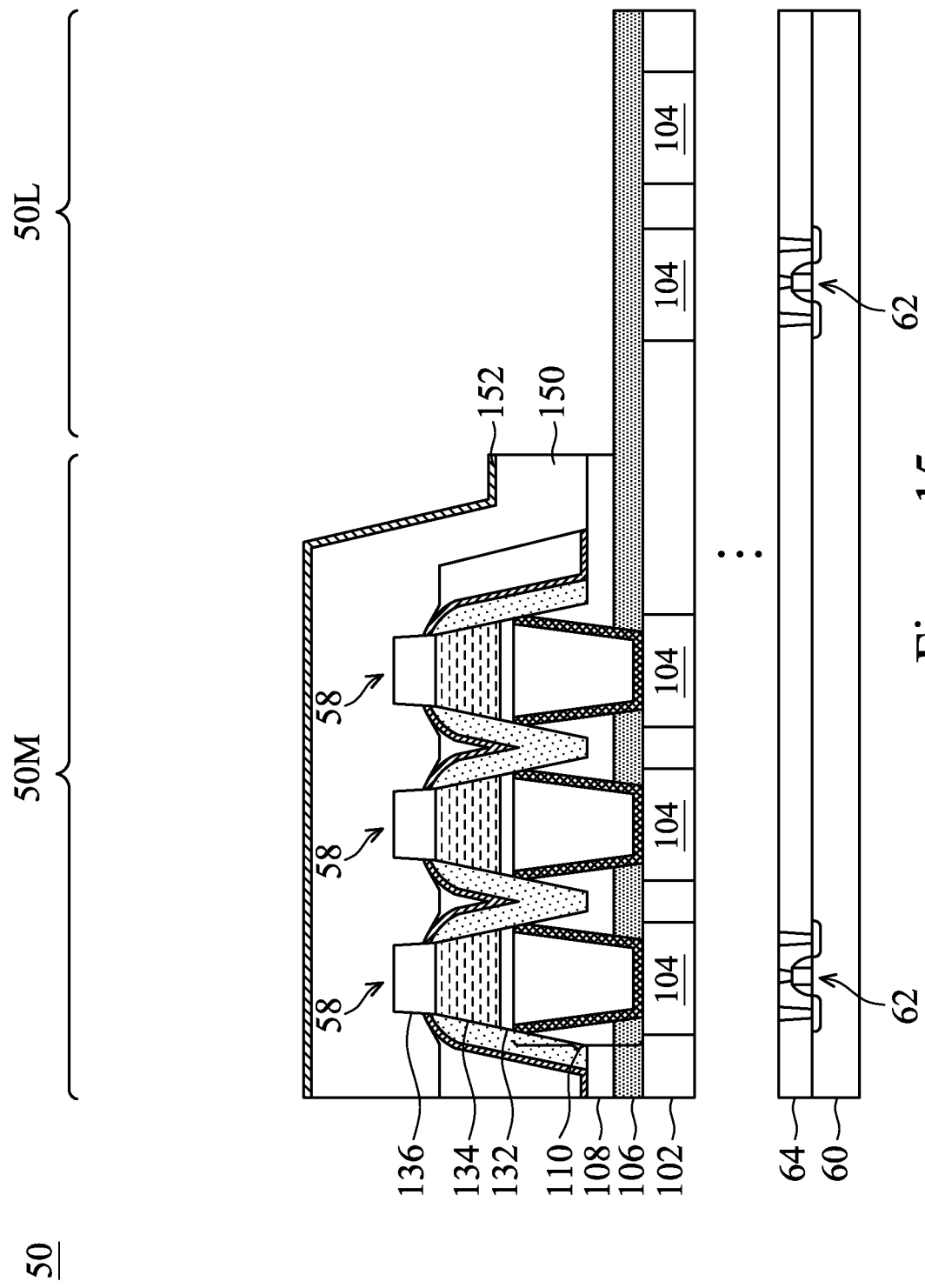

In FIG. 15, the anti-reflective layer 152, IMD layer 150, and IMD layer 108 are patterned to expose the etch stop layer 106 in the logic region 50L. In some embodiments, the patterning process may comprise suitable photolithography and etching processes. Portions of the anti-reflective layer 152 and IMD layer 150 in the memory region 50M remain after the patterning process.

Figure 16:
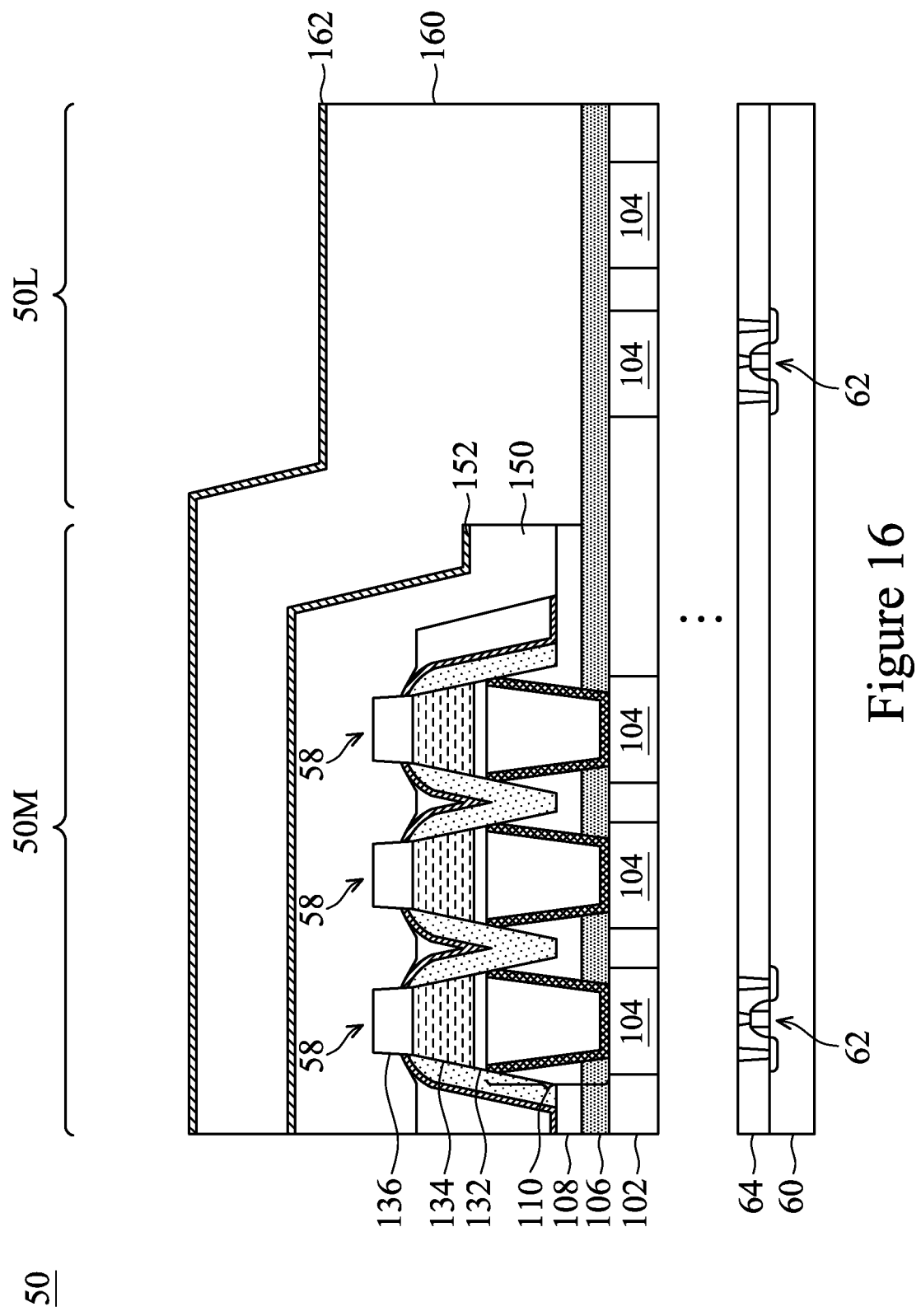

In FIG. 16, an IMD layer 160 is formed over the etch stop layer 106 and the remaining portions of the anti-reflective layer 152, the IMD layer 150, and the IMD layer 108. The IMD layer 160 is adjacent the IMD layers 108, 150. In some embodiments, the IMD layer 160 is formed using similar materials and methods as the IMD layer 108. An anti-reflective layer 162 is then formed on the IMD layer 160. In some embodiments, the anti-reflective layer 162 is formed using similar materials and methods as the anti-reflective layer 152.

Figure 17:
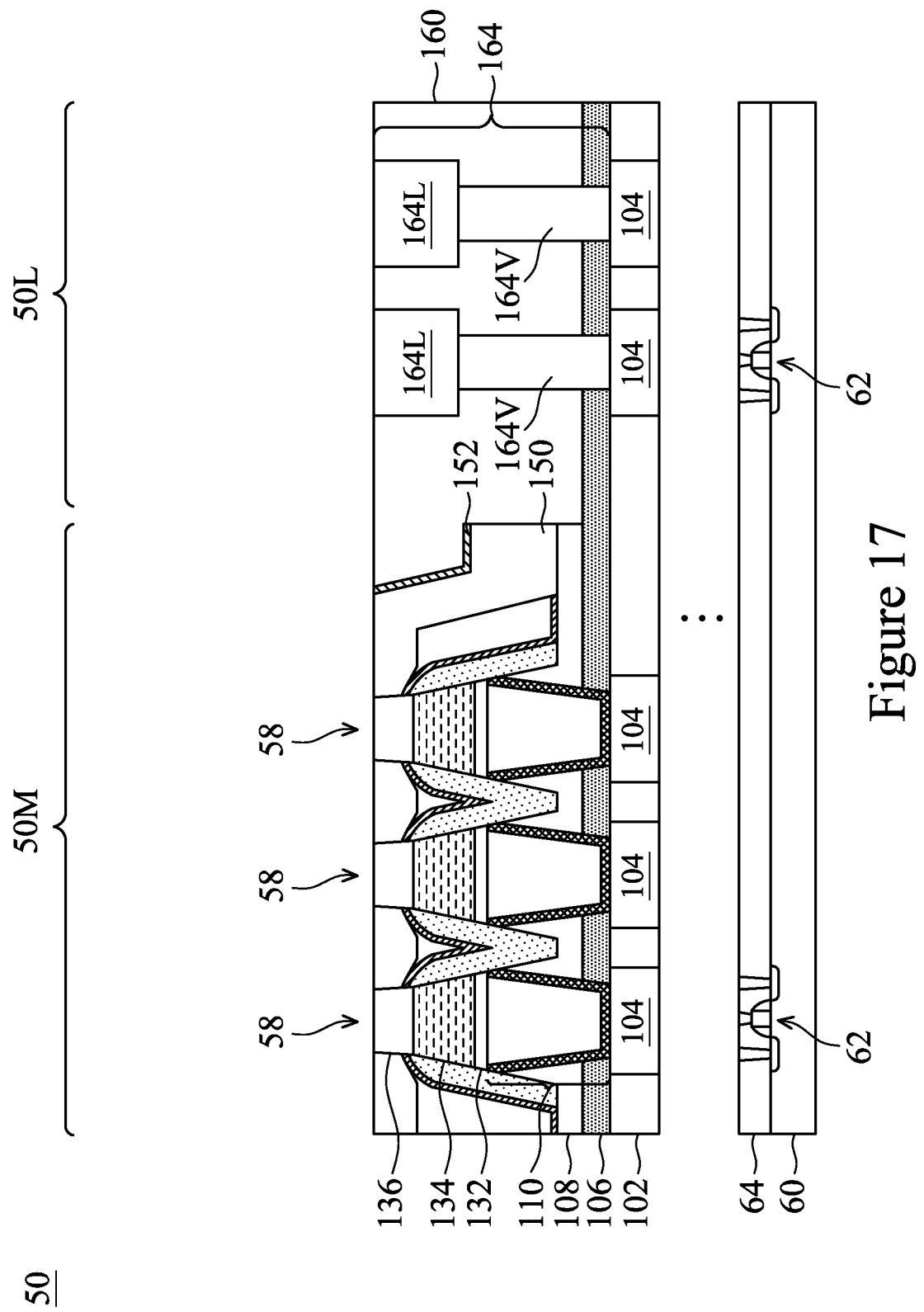

In FIG. 17, conductive features 164 are formed in the IMD layer 160 and etch stop layer 106. The conductive features 164 may include conductive lines 164L and conductive vias 164V, and are formed in the logic region 50L. The memory region 50M may be free from the conductive features 164. The conductive features 164 may be formed by suitable methods, such as a damascene process. Example damascene processes include single damascene processes, dual damascene processes, and the like. In some embodiments, openings for the conductive features 164 are formed by a via-first process. In other embodiments, openings for the conductive features 164 are formed by a trench-first process. The openings may be formed using suitable photolithography and etching techniques. Subsequently, the openings are filled with suitable conductive materials, such as copper, aluminum, combinations thereof, or the like. Next, a planarization process, such a CMP process, is performed to remove excess materials over the memory region 50M and expose the top electrodes 136. In some embodiments, the top surfaces of the top electrodes 136 are planar with the top surfaces of the conductive features 164 after planarization. In some embodiments, the planarization process completely removes the anti-reflective layer 162 (see FIG. 16). Although each conductive via 164V and corresponding conductive line 164L is illustrated as a separate element, it should be appreciated that they may be a continuous conductive feature, such as in embodiments where they are formed by a dual damascene process.

Figure 18:
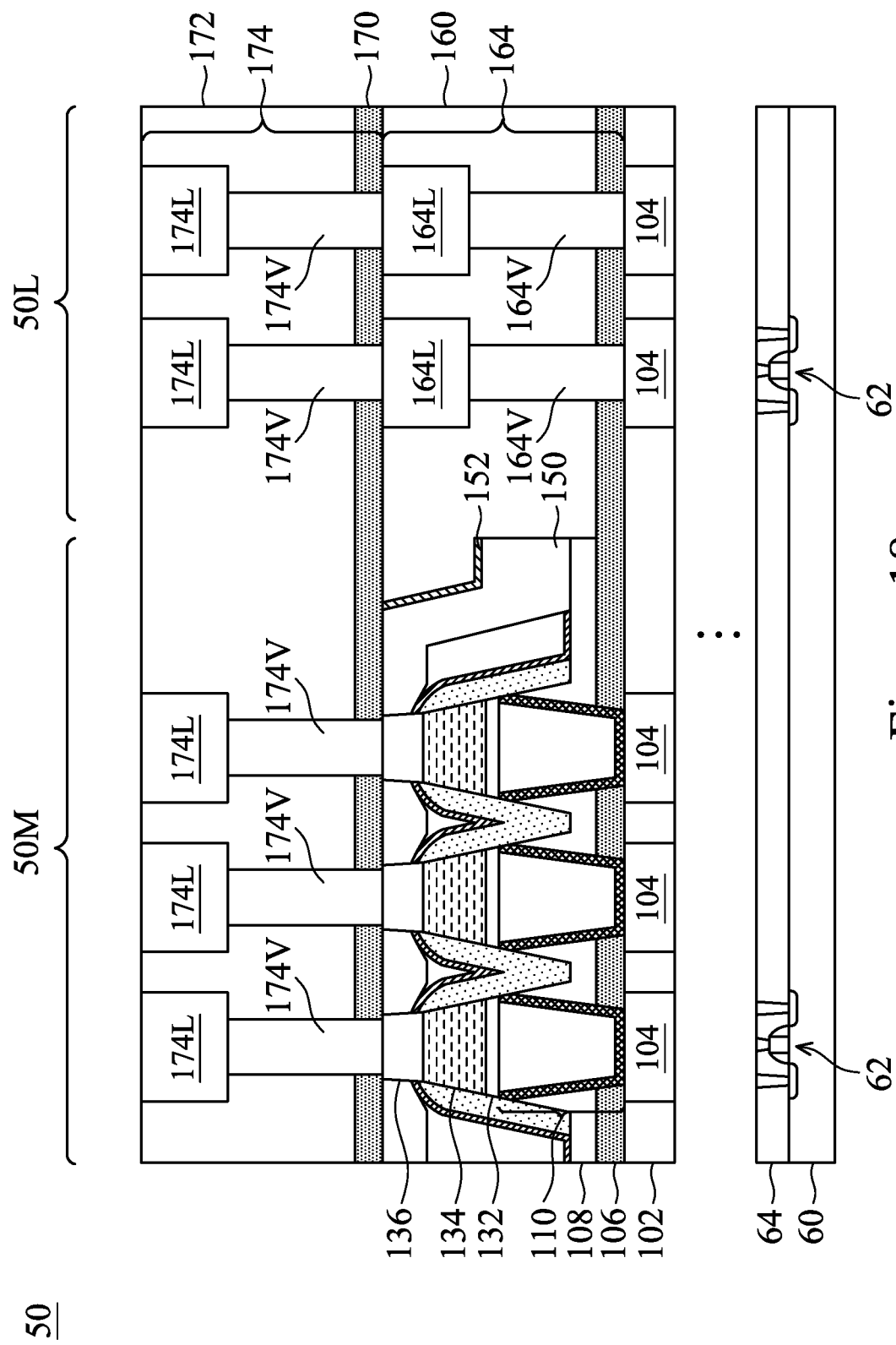

In FIG. 18, another metallization layer of the interconnect structure (e.g., M6, see FIG. 2) is formed. The metallization layer comprises an etch stop layer 170, an IMD layer 172, and conductive features 174. The conductive features 174 include conductive vias 174V (which can correspond to the metal vias V6, see FIG. 2) and conductive lines 174L (which can correspond to the metal lines L6, see FIG. 2). The conductive features 174 are formed in both the logic region 50L and memory region 50M. In some embodiments, the etch stop layer 170 is formed using similar materials and methods as the etch stop layer 106. In some embodiments, the IMD layer 172 is formed using similar materials and methods as the IMD layer 160. In some embodiments, the conductive features 174 are formed using similar materials and methods as the conductive features 164. The conductive features 174 are electrically coupled to the memory devices (e.g., MRAMs) formed in the memory region 50M and the logic devices (e.g., logic circuits) formed in the logic region 50L. Specifically, the conductive features 174 are physically and electrically coupled to the conductive features 164 and the top electrodes 136. In some embodiments, the conductive features 174 electrically couple the memory devices to the logic devices. For example, the conductive features 174 can be used to electrically couple some of the conductive features 164 to some of the top electrodes 136, such as in the illustrated metallization layer, or in another metallization layer. Although each conductive via 174V and corresponding conductive line 174L is illustrated as a separate element, it should be appreciated that they may be a continuous conductive feature, such as in embodiments where they are formed by a dual damascene process.

Figure 21:
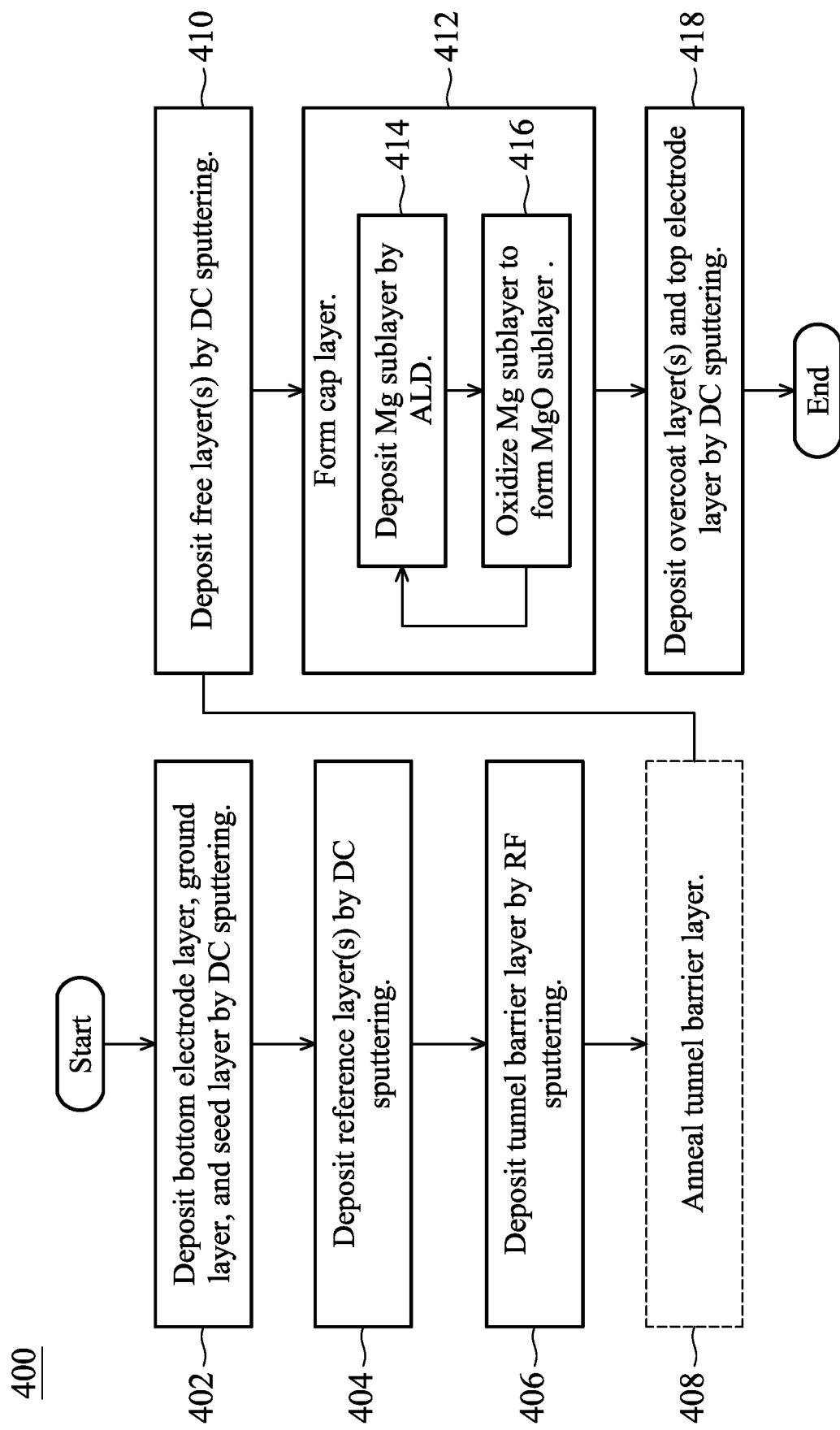
FIG. 21 is a flow chart of an example method for manufacturing a semiconductor device, in accordance with some other embodiments.

FIG. 21 is a flow chart of an example method 400 for manufacturing the semiconductor device 50, in accordance with some other embodiments. The method 400 includes steps 402, 404, 406, 408, 410, 418, which respectively are similar to the steps 202, 204, 206, 208, 210, 218 of the method 200 (see FIG. 19). In this embodiment, the cap layer 118F (see FIGS. 9A through 9E) is also deposited in step 412 by multiple deposition and oxidation steps, however, the deposition is by ALD instead of by DC sputtering. Specifically, in step 414, an ALD module is used to deposit a pure magnesium sublayer. Next, in step 416, the deposited magnesium sublayer is oxidized in the ALD module to form a magnesium oxide layer. Steps 414 and 416 can be repeated until the magnesium oxide layer is a desired thickness, thus forming the cap layer 118F. Depositing the magnesium sublayers by ALD in step 414 may offer a finer degree of control over the final thickness $T_2$ of the cap layer 118F (see FIG. 8).

Embodiments may achieve advantages. Forming the cap layer 118F by repeated deposition and oxidation allows the cap layer 118F to be formed of magnesium oxide having a high concentration of oxygen. In some embodiments, the cap layer 118F can be fully oxidized magnesium. Forming the cap layer 118F of fully oxidized magnesium allows the perpendicular magnetic anisotropy (PMA) of the resulting MTJ elements 134 to be increased, thereby increasing the relative change of resistance between the high resistance ($R_{AP}$) and a low resistance ($R_P$) states of the MRAM cells 58. The write error rate (WER) and read error rate (RER) of the MRAM cells 58 can thus be improved.

In an embodiment, a device includes: a substrate including active devices; a first inter-metal dielectric (IMD) layer; a first conductive feature extending through the first IMD layer, the first conductive feature electrically coupled to the active devices; a bottom electrode over the first conductive feature; a magnetic tunnel junction element including: a reference layer over the bottom electrode; a tunnel barrier layer over the reference layer, the tunnel barrier layer including oxidized magnesium; a free layer over the tunnel barrier layer; and a cap layer over the free layer, the cap layer including oxidized magnesium, the oxidized magnesium of the cap layer being more oxidized than the oxidized magnesium of the tunnel barrier layer; a top electrode over the cap layer; a second IMD layer over the top electrode; and a second conductive feature extending through the second IMD layer, the second conductive feature contacting the top electrode.

In some embodiments, the device further includes: a spacer around the bottom electrode and the magnetic tunnel junction element; and a third IMD layer around the spacer and the top electrode; a fourth IMD layer adjacent the first IMD layer and the third IMD layer; and a third conductive feature extending through the fourth IMD layer, the third conductive feature electrically coupled to the active devices. In some embodiments of the device, the tunnel barrier layer has equal atomic concentrations of magnesium and oxygen. In some embodiments of the device, a ratio of oxygen to magnesium in the tunnel barrier layer is in a range of 0.95 to 1.05, and the tunnel barrier layer has a thickness in a range of 0.6 nm to 1.2 nm. In some embodiments of the device, the cap layer has a greater atomic concentration of oxygen than magnesium. In some embodiments of the device, a ratio of oxygen to magnesium in the cap layer is in a range of 1.0 to 1.2, and the cap layer has a thickness in a range of 0.4 nm to 1.0 nm.

In an embodiment, a device includes: a magnetoresistive random access memory cell including: a bottom electrode; a reference layer over the bottom electrode; a tunnel barrier layer over the reference layer, the tunnel barrier layer including a first composition of magnesium and oxygen; a free layer over the tunnel barrier layer, the free layer having a lesser coercivity than the reference layer; a cap layer over the free layer, the cap layer including a second composition of magnesium and oxygen, the second composition of magnesium and oxygen having a greater atomic concentration of oxygen and a lesser atomic concentration of magnesium than the first composition of magnesium and oxygen; and a top electrode over the cap layer.

In some embodiments, the device further includes: a row decoder; a word line electrically coupling the row decoder to the bottom electrode; a column decoder; and a bit line electrically coupling the column decoder to the top electrode. In some embodiments of the device, the first composition of magnesium and oxygen has equal atomic concentrations of magnesium and oxygen, where the second composition of magnesium and oxygen has a greater atomic concentration of oxygen than magnesium. In some embodiments of the device, a ratio of oxygen to magnesium in the tunnel barrier layer is in a range of 0.95 to 1.05, and the tunnel barrier layer has a thickness in a range of 0.6 nm to 1.2 nm. In some embodiments of the device, a ratio of oxygen to magnesium in the cap layer is in a range of 1.0 to 1.2, and the cap layer has a thickness in a range of 0.4 nm to 1.0 nm. In some embodiments of the device, the cap layer has a more uniform oxygen concentration than the tunnel barrier layer.

In an embodiment, a method includes: forming a bottom electrode layer over a substrate; forming a ground layer over the bottom electrode layer; forming a seed layer over the ground layer; forming reference layers over the seed layer; forming a tunnel barrier layer over the reference layers by sputtering magnesium oxide with radio frequency (RF) sputtering; forming free layers over the tunnel barrier layer; forming a cap layer over the free layers by repeatedly depositing and oxidizing magnesium; forming a top electrode layer over the cap layer; and patterning the top electrode layer, the cap layer, the free layers, the tunnel barrier layer, the reference layers, the seed layer, the ground layer, and the bottom electrode layer to form a magnetoresistive random access memory cell.

In some embodiments of the method: the bottom electrode layer, the ground layer, and the seed layer are formed in a first multiple-target DC sputtering module; the reference layers are formed in a second multiple-target DC sputtering module; the tunnel barrier layer is formed in a two-target RF sputtering module; the free layers are formed in a third multiple-target DC sputtering module; the cap layer is formed in a one-target DC sputtering module; and the top electrode layer is formed in a fourth multiple-target DC sputtering module. In some embodiments, the method further includes: before forming the tunnel barrier layer, performing a metallic pasting process in the two-target RF sputtering module. In some embodiments of the method, the forming the cap layer includes: depositing a first magnesium sublayer on the free layers, the first magnesium sublayer having a first thickness, the first thickness being in a range of 0.2 nm to 0.4 nm; flowing oxygen gas over the first magnesium sublayer at a first flow rate for a first duration, the first flow rate being in a range of 8 sccm to 40 sccm, the first duration being in a range of 10 seconds to 40 seconds; depositing a second magnesium sublayer on the first magnesium sublayer, the second magnesium sublayer having a second thickness, the second thickness being in a range of 0.08 nm to 0.24 nm; and flowing oxygen gas over the second magnesium sublayer at a second flow rate for a second duration, the second flow rate being in a range of 1 sccm to 20 sccm, the second duration being in a range of 10 seconds to 40 seconds; depositing a third magnesium sublayer on the second magnesium sublayer, the third magnesium sublayer having a third thickness, the third thickness being in a range of 0.08 nm to 0.24 nm; flowing oxygen gas over the third magnesium sublayer at a third flow rate for a third duration, the third flow rate being in a range of 1 sccm to 20 sccm, the third duration being in a range of 10 seconds to 40 seconds; depositing a fourth magnesium sublayer on the third magnesium sublayer, the fourth magnesium sublayer having a fourth thickness, the fourth thickness being in a range of 0.08 nm to 0.24 nm; flowing oxygen gas over the fourth magnesium sublayer at a fourth flow rate for a fourth duration, the fourth flow rate being in a range of 100 sccm to about 1000 sccm, the fourth duration being in a range of 10 seconds to 40 seconds; and depositing a fifth magnesium sublayer on the fourth magnesium sublayer. In some embodiments of the method, each of the first magnesium sublayer, the second magnesium sublayer, the third magnesium sublayer, the fourth magnesium sublayer, and the fifth magnesium sublayer are deposited by direct current (DC)

sputtering. In some embodiments of the method, each of the first magnesium sublayer, the second magnesium sublayer, the third magnesium sublayer, the fourth magnesium sublayer, and the fifth magnesium sublayer are deposited by atomic layer deposition (ALD). In some embodiments of the method, each of the first magnesium sublayer, the second magnesium sublayer, the third magnesium sublayer, the fourth magnesium sublayer, and the fifth magnesium sublayer are deposited and oxidized in a same module without breaking a vacuum in the module between each deposition and flowing step. In some embodiments of the method, the fourth flow rate is greater than each of the first flow rate, the second flow rate, and the third flow rate, where the fourth duration is greater than each of the first duration, the second duration, and the third duration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a bottom electrode layer over a substrate;
    forming a ground layer over the bottom electrode layer;
    forming a seed layer over the ground layer;
    forming reference layers over the seed layer;
    forming a tunnel barrier layer over the reference layers by sputtering magnesium oxide with radio frequency (RF) sputtering;
    forming free layers over the tunnel barrier layer;
    forming a cap layer over the free layers by repeatedly depositing and oxidizing magnesium;
    forming a top electrode layer over the cap layer, the cap layer comprising magnesium oxide extending continuously between the top electrode layer and the free layers; and
    patterning the top electrode layer, the cap layer, the free layers, the tunnel barrier layer, the reference layers, the seed layer, the ground layer, and the bottom electrode layer to form a magnetoresistive random access memory cell.

2. The method of claim 1, wherein:
    the bottom electrode layer, the ground layer, and the seed layer are formed in a first multiple-target DC sputtering module;
    the reference layers are formed in a second multiple-target DC sputtering module;
    the tunnel barrier layer is formed in a two-target RF sputtering module;
    the free layers are formed in a third multiple-target DC sputtering module;
    the cap layer is formed in a one-target DC sputtering module; and
    the top electrode layer is formed in a fourth multiple-target DC sputtering module.

3. The method of claim 2 further comprising:
    before forming the tunnel barrier layer, performing a metallic pasting process in the two-target RF sputtering module.

4. The method of claim 3, wherein the forming the cap layer comprises:
    depositing a first magnesium sublayer on the free layers, the first magnesium sublayer having a first thickness, the first thickness being in a range of 0.2 nm to 0.4 nm;
    flowing oxygen gas over the first magnesium sublayer at a first flow rate for a first duration, the first flow rate being in a range of 8 sccm to 40 sccm, the first duration being in a range of 10 seconds to 40 seconds;
    depositing a second magnesium sublayer on the first magnesium sublayer, the second magnesium sublayer having a second thickness, the second thickness being in a range of 0.08 nm to 0.24 nm;
    flowing oxygen gas over the second magnesium sublayer at a second flow rate for a second duration, the second flow rate being in a range of 1 sccm to 20 sccm, the second duration being in a range of 10 seconds to 40 seconds;
    depositing a third magnesium sublayer on the second magnesium sublayer, the third magnesium sublayer having a third thickness, the third thickness being in a range of 0.08 nm to 0.24 nm;
    flowing oxygen gas over the third magnesium sublayer at a third flow rate for a third duration, the third flow rate being in a range of 1 sccm to 20 sccm, the third duration being in a range of 10 seconds to 40 seconds;
    depositing a fourth magnesium sublayer on the third magnesium sublayer, the fourth magnesium sublayer having a fourth thickness, the fourth thickness being in a range of 0.08 nm to 0.24 nm;
    flowing oxygen gas over the fourth magnesium sublayer at a fourth flow rate for a fourth duration, the fourth flow rate being in a range of 100 sccm to about 1000 sccm, the fourth duration being in a range of 10 seconds to 40 seconds; and
    depositing a fifth magnesium sublayer on the fourth magnesium sublayer.

5. The method of claim 4, wherein each of the first magnesium sublayer, the second magnesium sublayer, the third magnesium sublayer, the fourth magnesium sublayer, and the fifth magnesium sublayer are deposited by direct current (DC) sputtering.

6. The method of claim 4, wherein each of the first magnesium sublayer, the second magnesium sublayer, the third magnesium sublayer, the fourth magnesium sublayer, and the fifth magnesium sublayer are deposited by atomic layer deposition (ALD).

7. The method of claim 4, wherein each of the first magnesium sublayer, the second magnesium sublayer, the third magnesium sublayer, the fourth magnesium sublayer, and the fifth magnesium sublayer are deposited and oxidized in a same module without breaking a vacuum in the module between each deposition and flowing step.

8. The method of claim 4, wherein the fourth flow rate is greater than each of the first flow rate, the second flow rate, and the third flow rate, and wherein the fourth duration is greater than each of the first duration, the second duration, and the third duration.

9. A method comprising:
    depositing a reference layer over a bottom electrode layer;
    depositing a tunnel barrier layer over the reference layer by sputtering magnesium oxide with radio frequency (RF) sputtering;
    depositing a free layer over the tunnel barrier layer;

forming a cap layer over the free layer by repeatedly depositing and oxidizing magnesium, the cap layer comprising magnesium oxide directly contacting the free layer;

depositing a top electrode layer over the cap layer; and patterning the top electrode layer, the cap layer, the free layer, the tunnel barrier layer, the reference layer, and the bottom electrode layer to form a magnetoresistive random access memory cell.

10. The method of claim 9, wherein the magnesium of the cap layer is deposited by direct current (DC) sputtering.

11. The method of claim 9, wherein the magnesium of the cap layer is deposited by atomic layer deposition (ALD).

12. The method of claim 9, wherein the cap layer is deposited without breaking a vacuum between each deposition and oxidizing step.

13. The method of claim 9, wherein the cap layer has a greater oxygen concentration than the tunnel barrier layer.

14. The method of claim 9, wherein the forming the cap layer comprises:

depositing a first magnesium sublayer on the free layer;

flowing oxygen gas over the first magnesium sublayer at a first flow rate for a first duration;

depositing a second magnesium sublayer on the first magnesium sublayer;

flowing oxygen gas over the second magnesium sublayer at a second flow rate for a second duration;

depositing a third magnesium sublayer on the second magnesium sublayer;

flowing oxygen gas over the third magnesium sublayer at a third flow rate for a third duration;

depositing a fourth magnesium sublayer on the third magnesium sublayer; and flowing oxygen gas over the fourth magnesium sublayer at a fourth flow rate for a fourth duration, wherein the fourth flow rate is greater than the third flow rate, the second flow rate, and the first flow rate, and wherein the fourth duration is greater than the third duration, the second duration, and the first duration.

15. The method of claim 9, wherein the forming the cap layer comprises:

depositing a first magnesium sublayer on the free layer, the first magnesium sublayer having a first thickness;

oxidizing the first magnesium sublayer;

depositing a second magnesium sublayer on the first magnesium sublayer, the second magnesium sublayer having a second thickness;

oxidizing the second magnesium sublayer;

depositing a third magnesium sublayer on the second magnesium sublayer, the third magnesium sublayer having a third thickness;

oxidizing the third magnesium sublayer;

depositing a fourth magnesium sublayer on the third magnesium sublayer, the fourth magnesium sublayer having a fourth thickness, wherein the first thickness is greater than the second thickness, the third thickness, and the fourth thickness; and oxidizing the fourth magnesium sublayer.

16. A method comprising:

forming a perpendicular magnetic tunnel junction stack over a bottom electrode layer, the perpendicular magnetic tunnel junction stack comprising:

a reference layer;

a tunnel barrier layer over the reference layer, the tunnel barrier layer comprising a first composition of magnesium and oxygen;

a free layer over the tunnel barrier layer; and a cap layer over the free layer, the cap layer comprising a second composition of magnesium and oxygen, the second composition of magnesium and oxygen having a greater atomic concentration of oxygen and a lesser atomic concentration of magnesium than the first composition of magnesium and oxygen;

forming a top electrode layer on the perpendicular magnetic tunnel junction stack; and patterning the top electrode layer, the perpendicular magnetic tunnel junction stack, and the bottom electrode layer to form a magnetoresistive random access memory cell.

17. The method of claim 16, wherein forming the perpendicular magnetic tunnel junction stack comprises:

depositing a first material of the free layer with a first type of sputtering; and depositing a second material of the cap layer with a second type of sputtering, the second type of sputtering being different from the first type of sputtering.

18. The method of claim 16, wherein forming the perpendicular magnetic tunnel junction stack comprises:

depositing the cap layer by repeatedly depositing and oxidizing magnesium.

19. The method of claim 16, wherein the first composition of magnesium and oxygen has equal atomic concentrations of magnesium and oxygen, and wherein the second composition of magnesium and oxygen has a greater atomic concentration of oxygen than magnesium.

20. The method of claim 16, wherein the cap layer has a more uniform oxygen concentration than the tunnel barrier layer.

* * * * *